United States Patent
Ueki et al.

(10) Patent No.: US 7,403,347 B2
(45) Date of Patent: Jul. 22, 2008

(54) OPTICAL TRANSMISSION MODULE WITH TEMPERATURE CONTROL

(75) Inventors: Tatsuhiko Ueki, Tokyo (JP); Tatsuya Kimoto, Tokyo (JP); Hiroyuki Kobayashi, Tokyo (JP); Toshikazu Mukaihara, Tokyo (JP); Mamoru Shimada, Tokyo (JP); Yuji Hiratani, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 77 days.

(21) Appl. No.: 10/956,079

(22) Filed: Oct. 4, 2004

(65) Prior Publication Data

US 2005/0117231 A1   Jun. 2, 2005

Related U.S. Application Data

(63) Continuation of application No. PCT/JP03/04268, filed on Apr. 3, 2003.

(30) Foreign Application Priority Data

Apr. 4, 2002 (JP) ............................. 2002-103125
Jun. 17, 2002 (JP) ............................. 2002-176217

(51) Int. Cl.
*G02B 7/02* (2006.01)
*H01S 3/04* (2006.01)
*H01S 3/00* (2006.01)

(52) U.S. Cl. ..................... 359/820; 372/34; 372/36; 372/38.02

(58) Field of Classification Search ............... 359/820; 372/20, 29.02, 32, 34, 36, 38.01, 38.02
See application file for complete search history.

(56) References Cited

U.S. PATENT DOCUMENTS

| | | | | |
|---|---|---|---|---|
| 5,603,570 | A * | 2/1997 | Shimizu | ..................... 374/100 |
| 6,487,027 | B2 * | 11/2002 | Yamauchi et al. | ........... 359/820 |
| 6,807,208 | B2 * | 10/2004 | Nasu et al. | .................... 372/36 |
| 6,937,628 | B2 * | 8/2005 | Tatsuno et al. | ................. 372/19 |
| 2001/0033592 | A1 | 10/2001 | Yamauchi et al. | |
| 2003/0002255 | A1 | 1/2003 | Tayebati et al. | |
| 2003/0098299 | A1 * | 5/2003 | Hiramatsu et al. | ........ 219/444.1 |

FOREIGN PATENT DOCUMENTS

| | | |
|---|---|---|
| EP | 0 818 857 A1 | 1/1998 |
| JP | 4-75394 | 3/1992 |
| JP | 11-354890 | 12/1999 |
| JP | 2000-56185 | 2/2000 |
| JP | 2001-308444 | 11/2001 |
| JP | 2002-335036 | 11/2002 |

* cited by examiner

*Primary Examiner*—Ricky Mack
*Assistant Examiner*—Brandi N Thomas
(74) *Attorney, Agent, or Firm*—Oblon, Spivak, McClelland, Maier & Neustadt, P.C.

(57) ABSTRACT

An optical module including a temperature measurement module and an optical part having a temperature dependency. The module includes a temperature control part mounted directly or indirectly on the optical part and the temperature measurement part for controlling a temperature of the optical part and the measurement part by thermal contact. An adjustment system is also provided for adjusting a difference of the temperature of the optical part and the measurement part by controlling the heat flow into/out of the optical part or the measurement part.

11 Claims, 16 Drawing Sheets

● locked wavelength when the optical filter temperature increases
○ locked wavelength when the optical filter temperature decreases control unit

OPTICAL TRANSMISSION MODULE WITH TEMPERATURE CONTROL

CROSS REFERENCE TO RELATED APPLICATION

This application is a continuation of International Application No. PCT/JP03/04268 filed Apr. 3, 2003, the entire contents of which are incorporated herein.

TECHNICAL FIELD

The present invention relates to an optical transmitter used for optical communications, more particularly an optical module having a wavelength monitor used for a wavelength division multiplexing (WDM) communication, and an optical module or the like having a semiconductor laser diode element.

BACKGROUND

In WDM communication, an increase of transmission volume, a higher density multiplexing technique with a narrower wavelength band is adopted, wherein laser sources with accurately controlled wavelength have been required. Generally, it is required that a wavelength of an optical signal is stable for long period of time in high density WDM. Therefore, a wavelength monitor is needed for monitoring a change of wavelength of an optical signal and used for controlling to stabilize it. An optical module equipped with a conventional wavelength monitor is disclosed in Japanese Patent Provisional Publication No. 2000-56185 as an example.

FIG. 15 is a diagram showing a configuration of an optical module having a conventional wavelength monitor. As shown in FIG. 15, the conventional optical module comprises:

a laser diode 50 which emits a laser at predetermined oscillation wavelength;

an optical fiber 51 which is optically connected to the laser diode 50 and transmits a laser that emitted from a front portion (In FIG. 15, right-hand side) of the laser diode 50;

an optical filter 52 which allows to pass only the laser beam of a predetermined wavelength;

a beam splitter 53 comprising a half mirror which divides into two directions the laser beam (monitoring light) emitted from a rear portion (In FIG. 15, left-hand side) of the laser diode 50;

a 1st photodiode 54 which receives one of laser beam after divided by the beam splitter 53 and passed the optical filter 52;

a 2nd photodiode 55 which receives another laser beam after divided by the beam splitter 53;

a Peltier module 56 which controls a temperature of the laser diode 50;

and a control unit 57 which controls the Peltier module 56 to control the wavelength of laser diode 50 responding to a PD current generated by the 1st photodiode 54 and the 2nd photodiode 55.

A focusing lens 58 for coupling the laser emitted from the front portion of the laser diode 50 into the optical fiber 51 is placed between the laser diode 50 and the optical fiber 51. In addition, a collimator lens 59, which makes a parallel ray of the laser emitted from the rear portion of the laser diode 50, is placed between the laser diode 50 and the beam splitter 53.

The laser diode 50, the focusing lens 58, and the collimator lens 59 are mounted on the LD career 60. The 1st photodiode 54 and the 2nd photodiode 55 are mounted on the 1st PD career 61 and the 2nd PD career 62 respectively.

The wavelength monitor 63 is composed by the beam splitter 53, the optical filter 52, the 1st photodiode 54, the 2nd photodiode 55, the 1st PD career 61, and the 2nd PD career 62.

The laser diode 50 and the wavelength monitor 63 are placed within the package 64. And a ferrule 65 holding a tip of the optical fiber 51 is fixed to the side of the package 64 by a sleeve 66.

The laser beam emitted from the front portion of the laser diode 50 is focused by the focusing lens 58 and carried incident upon the optical fiber 51 held by the ferrule 65 and transmitted outside.

On the other hand, the laser emitted from the rear portion of the laser diode 50 is made to a parallel light ray by the collimator lens 59 and divided by the beam splitter 53 into two directions, whereof Z-axis direction (transmission direction) and X axis direction perpendicular to the Z-axis direction (reflection direction). The laser beam in the Z-axis direction is filtered in wavelength by the optical filter 52 and sensed by the 1st photodiode 54. The laser beam in the X-axis direction is sensed by the 2nd photodiode 55. The PD current from the 1st photodiode 54 and the 2nd photodiode 55 are fed to the control unit 57, and the control unit 57 controls the Peltier module 56 for controlling a temperature and maintaining a wavelength of the laser diode 50 corresponding to the PD current.

Furthermore, a laser module without such a wavelength monitor has been traditionally used as well, but even for such a conventional laser module, accurate controlling of temperature is needed for a semiconductor laser in order to improve its accuracy of the wavelength control. Refer to Japanese Patent Provisional Publication-No. 1992-75394.

The optical filter 52 furnished in the wavelength monitor 63 described above is made of, for example, Etalon having a temperature dependency in the optical transmission characteristics. One optical filter shows a shifting of 0.01 nm/degree C. for the wavelength dependency of transmission characteristics to the shorter wavelength side. Also, the heat transfers to the optical filter 52 by thermal radiation from the outside of the package 64, therefore the optical filter 52 has a temperature dependency on the case. So the wavelength of the optical signal may not be controlled well accurately in some cases due to a temperature change of the optical filter 52 with the conventional type wavelength monitor 63. Refer to Japanese Patent Provisional Publications No.2002-335036, No.2001-308444.

Furthermore, a laser diode of oscillator has a temperature dependency in the lasing wavelength, for example, a wavelength of a certain semiconductor laser shifts by 0.08 nm/degree C. Utilizing this, a variable wavelength type is made in some cases, however it is needed to control the temperature being constant in order to maintain the wavelength stabilized during its operation.

There are several methods for controlling a wavelength. One method is controlling a temperature by a temperature control unit while monitoring a change of the wavelength by a wavelength monitor, another is controlling a temperature by a temperature control unit while measuring a change of the temperature of the laser diode measured by a temperature sensor such as a thermistor.

As the ambient temperature changes, the amount of heat flow from the package into the laser diode through the bonding wire or the gas changes. In this situation, even if the temperature control for the laser diode and the thermistor is conducted on the same career, in some occasion the control may not follow the rapid change of the surrounding temperature, or when a temperature difference between the laser diode and the thermistor is produced, accurate measurement of the temperature is not taken. Consequently, it may cause a problem that the lasing wavelength cannot be stabilized.

In addition, the laser diode is cooled down to approximately 0 degree C. in order to have a wider variable range of the wavelength, while it may located where ambient temperature reaches 70 degree C. approximately at some conditions, wherein the amount of heat flow from the package becomes larger and hence it is likely to cause a large temperature difference between the laser diode and the thermistor.

SUMMARY OF THE INVENTION

One of the object of the invention is to provide an optical module which can adjust a temperature difference between an optical part and a temperature measurement part by means of adjusting the amount of heat flow into the optical part or the temperature measurement part.

Particularly, it provides a wavelength monitor and an optical module which can measure the temperature of the optical filter accurately by keeping a balance of the temperature change of the optical filter by the influence of heat flow induced by the temperature difference between the environment and the optical filter or the temperature measurement part. Or it provides an optical module which can control the temperature of a laser diode accurately by keeping a balance of the temperature change of the laser diode under an influence of the heat flow induced by the temperature difference between the atmosphere and the laser diode or the temperature measurement part.

Another object of the invention is to provide an optical module and a semiconductor laser diode module, wherein, a degradation of the performance resulted from a difference of temperature of the temperature control device or a delay of the temperature control are prevented by means of avoiding the heat flow through the wiring material which is used for electrical connection to the thermal adjustment part or the like when conducting an adjustment for the thermal adjustment part in the module.

One embodiment of an optical module according to the invention comprises, an optical part having a temperature dependency, a temperature measurement part, a temperature control part for controlling a temperature of the optical part and the measurement part by thermal contact directly, or indirectly through a career thereon, an adjustment system for adjusting a difference of temperature between the optical part and the temperature measurement part by controlling the amount of heat flow to the optical part or the temperature measurement part, and a package contains the optical part, the temperature measurement part, the temperature control part, and the adjustment system.

Another embodiment of an optical module according to the invention includes an adjustment system which is composed from a thermal conduction adjustment part for adjusting the thermal conductivity between the optical part or the temperature measurement part and the temperature adjustment part.

Another embodiment of an optical module according to the invention includes a thermal conductivity adjustment part which is made of electric conductive material.

Another embodiment of an optical module according to the invention includes an adjustment system having thermal conductive material which connects the temperature control device to one portion of the optical part or the temperature measurement part wherein not connected to the temperature control part.

Another embodiment of an optical module according to the invention includes a thermal conductive material forming a wire.

Another embodiment of an optical module according to the invention includes a method of adjusting thermal conductivity of the wire by changing at least one of a length, a diameter, a number of wires or material of the wire.

Another embodiment of an optical module according to the invention includes an adjustment system which adjusting a thermal conductivity between the optical part or the temperature measurement part and the package corresponding to a thermal resistance between the optical part or the temperature measurement part and the temperature control part.

Another embodiment of an optical module according to the invention includes an adjustment system which is composed from the thermal conductivity adjustment part which connects the temperature control part to one portion of the optical part or the temperature measurement part wherein not connected to the temperature control part.

Another embodiment of an optical module according to the invention includes a thermal conductivity adjustment part forming a wire.

Another embodiment of an optical module according to the invention includes a thermal conductivity adjustment part having an electrically conducting function.

Another embodiment of an optical module according to the invention includes an adjustment system which is composed from gas filled in the package and adjusts the heat transfer between the optical part or the temperature measurement part and the package.

Another embodiment of an optical module according to the invention includes a method of adjusting the thermal conductivity of the gas by varying a kind of gas or a pressure of the gas.

Another embodiment of an optical module according to the invention includes an adjustment system which is formed from the thermal conductive part adjusting the heat transfer between the optical part and the temperature measurement part.

Another embodiment of an optical module according to the invention comprises an optical part having a temperature dependency, a temperature measurement part, a 1st temperature control part for controlling a temperature of the optical part and the measurement part by thermal contact directly, or indirectly through a career thereon, a 2nd temperature control part on which neither the optical part nor the measurement part is mounted, a thermal conductive part which is placed with thermal connect between the optical part or the measurement part and the 2nd temperature control device, and a package contains the optical part, the temperature measurement part, the 1st temperature control part, the 2nd temperature control part and the thermal conductive part.

Another embodiment of an optical module according to the invention includes a thermal conductive part formed from a wire which connects the 2nd temperature control part to one portion of the optical part or the temperature measurement part wherein not connected to the 1st temperature control part.

Another embodiment of an optical module according to the invention includes a wire which is wired between the 2nd temperature control part and the terminal in the package, further the wire is electrically connected to the terminal in the package.

Another embodiment of an optical module according to the invention includes an optical part which has a temperature dependency being an optical filter.

Another embodiment of an optical module according to the invention includes an optical part which has a temperature dependency being a semiconductor laser element.

Another embodiment of an optical module according to the invention includes a 1st temperature control part which is formed from a thermoelectric module contains a plurality of thermoelectric modules piled up wherein each thermoelectric module is controlled independently or cooperatively.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
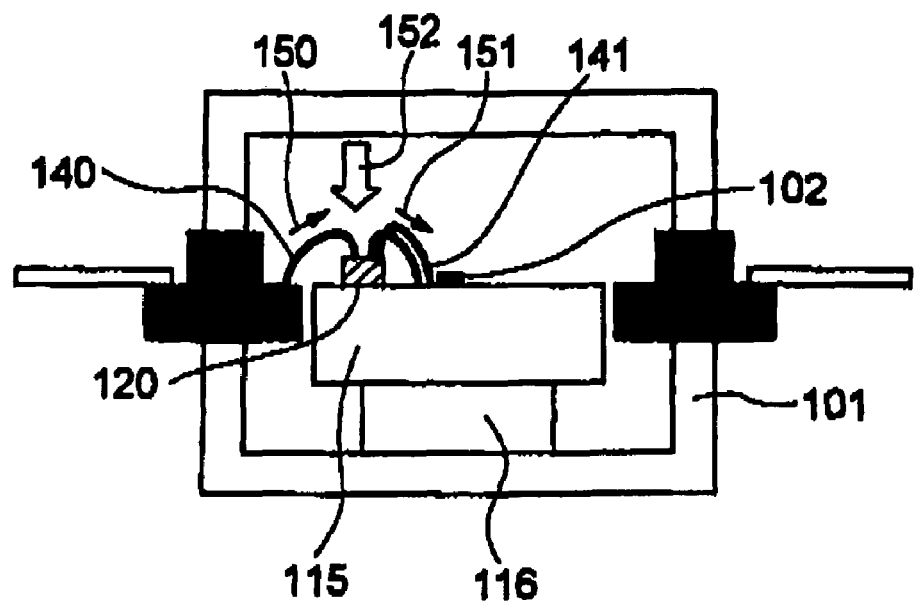
FIG. 1 shows the first embodiment of the optical module in accordance with the invention.

Details of an optical module according to the invention will be described below referring to the drawings.

One embodiment of the optical module according to the invention comprises:

an optical part having a temperature dependency;

a temperature measurement part;

a temperature control part for controlling a temperature of the optical part and the temperature measurement part by means of thermal contact either directly or indirectly through a career wherein those parts are placed thereon;

an adjustment system for adjusting a difference of temperature between the optical part and the temperature measurement part by compensating the amount of heat flow to the optical part or the temperature measurement part;

and a package containing the optical part, the temperature measurement part, the temperature control part and the temperature adjustment system.

In the optical module according to the invention, in order to reduce a difference of temperature between the laser diode and the thermistor, or between the optical filter and the thermistor, it is necessary to control the amount of heat flow induced by a temperature difference between these parts and the package and make a balance of the heat flow (Typically almost all the case, the temperature of the package is higher to others, so the heat flows into these parts from the package. Although its opposite condition can be considered, but it is negligible rare case.). A path of heat flow can be through the bonding wire which electrically connects the terminal inside of the package to these parts, and the inner gas filled in the package or the like.

The adjustment system for adjusting the amount of heat flow of the invention is applied to adjust the difference of temperature between the optical part and the temperature measurement part by compensating the amount of heat flow to the optical part or the temperature measurement part. For example, by adding a bonding wire or other material between the thermistor and its career or between the laser diode and the career, another thermal circuit is formed additionally to the existing thermal circuit of the bonding wire which is functionally needed electrically. By this thermal circuit, it makes possible to adjust the pseudo thermal resistance of the thermistor or other parts.

The invention provides to solve following problem. Although the thermistor and the LD element are mounted on the same board, the temperature difference is inevitably produced as the heat flow balance between these parts and the package or the board is different because these physical sizes and the thermal resistance are different. Therefore, when the atmosphere temperature changes, the case temperature changes accordingly, and it will cause a change of the wavelength, the threshold current and the slope efficiency, hence the performance as a signal light source degrades.

In order to solve the problem, a thermal circuit is formed by Au wire bonding or others between the thermal reference point and the thermistor in accordance with the invention. By adding the thermal circuit, the pseudo thermal resistance of the thermistor can be adjusted so that the change of the thermistor temperature vs. atmosphere temperature becomes the same as for the change of LD temperature.

Hereafter, the details of the optical module of the invention will be described.

Figure 7:
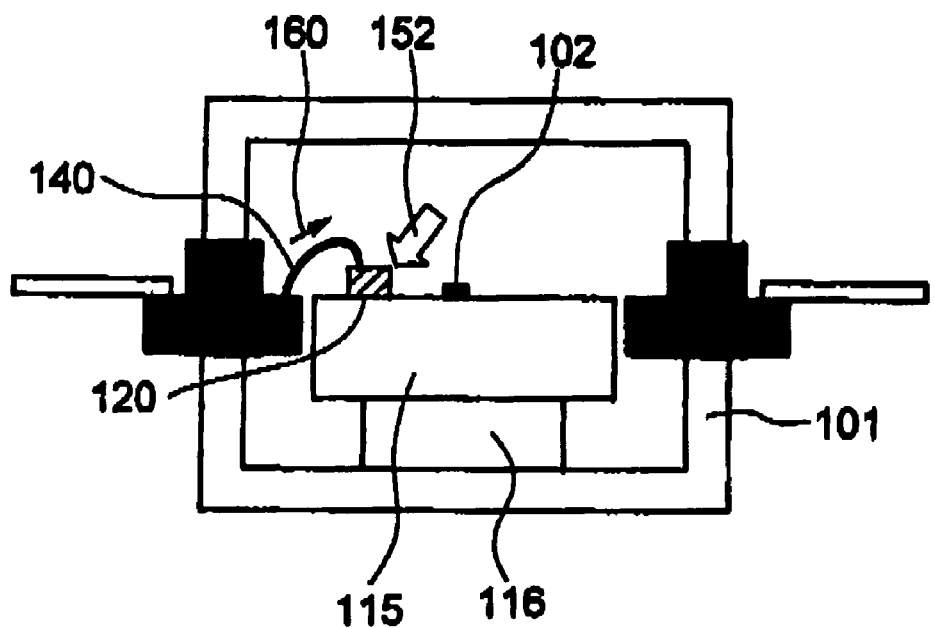
FIG. 7 shows a conventional type optical module.

FIG. 7 shows a conventional type optical module. In the optical module shown in FIG. 7, the LD 102 and the thermistor 120 are mounted on the LD mount 115 which is made of high thermal conductivity material, and temperature of the whole LD mount is controlled by the temperature control unit (TEC) 116. The package 101 and the thermistor 120 are connected by Au wire etc, and the LD temperature is measured by the thermistor 120 for control. When the temperature between the package 101 and the LD mount 115 is different, the heat flows into the thermistor 120 from the Au wire 140 as shown by an arrow 150, further the heat flows from the gas filled in the package as shown by an arrow 152. Consequently, the temperature of the thermistor is differed from the LD mount temperature, hence accurate LD temperature control may not be performed well. Although the wire is routed to the LD 102 from the package, since the wire is connected to a conductive pattern on the LD mount 115, the amount of the heat flow to the LD 102 from the package 101 is negligible small.

Figure 8:
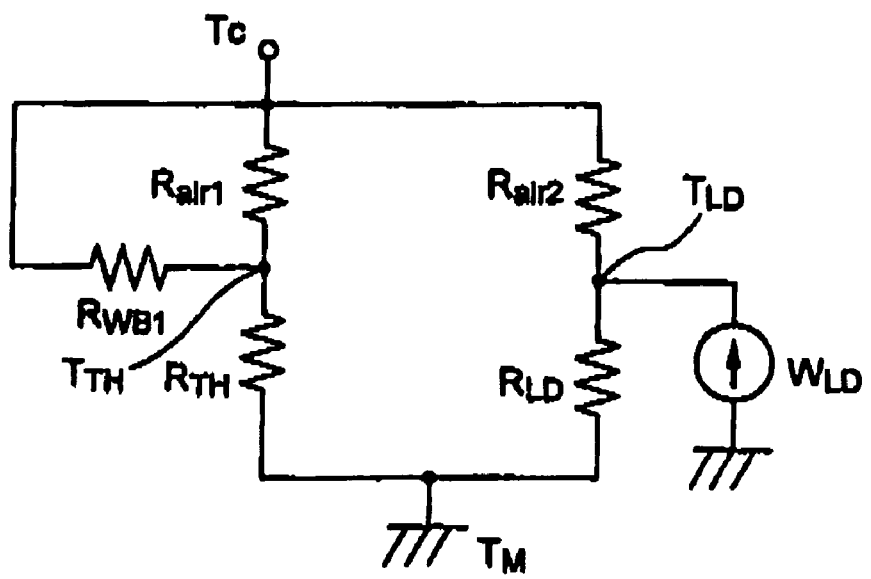
FIG. 8 is an explanatory thermal circuit diagram of the conventional type optical module shown in FIG. 7.

FIG. 8 is a explanatory thermal circuit diagram of a conventional type optical module shown in FIG. 7. In the thermal circuit diagram of FIG. 8, the LD mount temperature is set as a reference point. Abbreviations are expressed below respectively.

$T_M$: LD mount temperature, $T_{TH}$: Thermistor temperature, $T_{LD}$: LD temperature, $T_C$: Case (namely, package) temperature, $R_{TH}$: Thermal resistance between a LD mount and a thermistor, $R_{LD}$: Thermal resistance between a LD mount and a LD, $W_{LD}$: Heat generated by a LD, $R_{WB1}$: Thermal resistance of Au wire between a case and a thermistor, $R_{air1}$: Thermal resistance of gas between a case and a thermistor, $R_{air2}$: Thermal resistance of gas between a case and a LD.

Relation between the thermistor temperature and the LD temperature is shown as below formula:

$$T_{TH} = \frac{R_{TH}(T_C - T_M)}{R_{TH} + \frac{R_{air1}R_{WB1}}{R_{air1} + R_{WB1}}} + T_M \quad (1)$$

$$T_{LD} = \frac{R_{LD}[R_{air2} \cdot W_{LD} + (T_C - T_M)]}{R_{LD} + R_{air2}} + T_M \quad (2)$$

The amount of change of the thermistor and the LD temperature made by the change of the case temperature is shown as follows.

$$\Delta T_{TH} = \frac{R_{TH}}{R_{TH} + \frac{R_{air1}R_{WB1}}{R_{air1} + R_{WB1}}} \Delta T_C \quad (4)$$

$$\Delta T_{LD} = \frac{R_{LD}}{R_{LD} + R_{air2}} \Delta T_C \quad (5)$$

The amount of heat flow to the LD element from the surrounding gas is small as the volume of the LD element is very small. In that, $R_{air2} \gg R_{LD}$ and the constant number in formula is small.

On the contrary, the volume of the thermistor is larger than that of LD and the amount of heat flow from the gas is so large as the R air1 is not negligible. Moreover, the material used for the thermistor has low thermal conductivity; therefore, the $R_{TH}$ is relatively larger than the $R_{LD}$.

Furthermore, the bonding wire from the case to the electrode of the thermistor to supply electric power is made of Au wire of a high thermal conductivity, and the influence of the heat flow through the $R_{WB1}$ is very large. Therefore, the constant number in formula (4) is larger than that in formula (5).

From this, in the conventional structure, the thermistor temperature is not stable to the change of the case temperature, so it is difficult to monitor the LD temperature correctly. Since monitoring the temperature of the LD is not accurate, a change in the wavelength, the threshold current and the slope efficiency occurs, hence it will degrade the performance of the laser module required as a signal light source.

When the constant number in formula (4) and (5) is the same. I.e., $$R_{TH} = \frac{R_{air1}R_{WB1}}{R_{air1} + R_{WB1}} = R_{LD} : R_{air2} \quad (6)$$

the thermistor temperature and the LD temperature change similarly to the change of atmosphere temperature so the problem can be solved.

The reasons for not satisfying formula (6) in the conventional structure are following three points:

1. The heat flows into the thermistor through the bonding wire for supplying an electric power (Reason 1).
2. As the thermistor is larger than the LD, it is easily influenced by the surrounding temperature (Reason 2).
3. A thermal resistance of the thermistor is larger than the LD (Reason 3).

From above Reason 1 and 2, we obtain following formula as a result:

$$\frac{R_{air1}R_{WB1}}{R_{air1} + R_{WB1}} < R_{air2} \quad (7)$$

In this case, if $R_{TH}$ is smaller than $R_{LD}$ corresponding to the formula (7), the relation of formula (6) is satisfied, but because of the Reason 3, $$R_{TH} > R_{LD} \quad (8)$$

then, it is evident that formula (6) can not be realized.

One of objects of the invention is to satisfy the relationship of formula (6) by adjusting a apparent $R_{TH}$. As mentioned above, the relation of formula (6) can be satisfied by reducing the apparent $R_{TH}$ so that a direction of inequality symbol of formula (8) is reversed.

One method of reducing the apparent $R_{TH}$ is to form a thermal circuit by bonding an Au wire between the thermistor and the LD mount.

FIRST EMBODIMENT

FIG. 1 shows the 1st embodiment of the optical module of the invention. As shown in FIG. 1, an Au wire 141 is bonded between the thermistor 120 and the LD mount. Therefore, the heat which flows to the thermistor 120 from the package 1 and the gas as shown by an arrow 150, 152 is transferred to the LD mount through the Au wire 141 as shown by an arrow 151.

Figure 2:
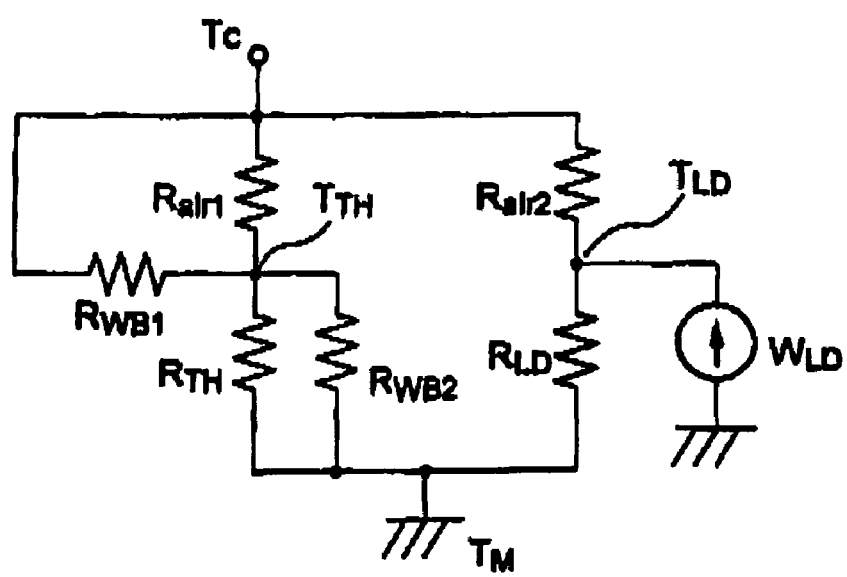
FIG. 2 is an explanatory thermal circuit diagram of the optical module in accordance with the invention shown in FIG. 1.

FIG. 2 is an explanatory thermal circuit diagram of the optical module of the invention shown in FIG. 1. The first embodiment will be described with a thermal circuit diagram shown in FIG. 2.

Abbreviations are expressed below respectively:

$T_M$: LD mount temperature, $T_{TH}$: Thermistor temperature, $T_{LD}$: LD temperature, $T_C$: Case temperature, $R_{TH}$: Thermal resistance between a LD mount and a thermistor, $R_{LD}$: Thermal resistance between a LD mount and a LD, $W_{LD}$: Heat generated by a LD, R_WB1: Thermal resistance of Au wire between a case and a thermistor, Rair1: Thermal resistance of gas between a case and a thermistor, Rair2: Thermal resistance of gas between a case and a LD. R_WB2: Thermal resistance of Au wire between a thermistor and a LD.

As described above in the first embodiment, an Au wire is added to the thermistor referring the reference temperature point being same as the LD mount temperature.

In this case, although the wire is not connected electrically, it can be used to serve as electrical conductor to the thermistor as well. The thermal resistance of the Au wire is expressed by R_WB2 in the thermal circuit diagram.

Here, the pseudo thermal resistance value is designated by R_TH', and it is expressed as following formula.

$$R_{TH'} = \frac{R_{TH} R_{WB2}}{R_{TH} + R_{WB2}} \quad (9)$$

The object of the first embodiment is to satisfy the relation of following formula by adjusting a apparent R_TH' as described above.

$$R_{TH'} = \frac{R_{air1} R_{WB1}}{R_{air1} + R_{WB1}} = R_{LD} : R_{air2} \quad (10)$$

In that, it is possible to satisfy the formula (10) by adjusting R_WB2 by varying a length, a diameter, and/or a number of the Au wires. Thereby, it can control to maintain same rate of the temperature change of the thermistor as the LD for the change of the atmosphere temperature. Then, the thermistor becomes possible to monitor the LD temperature accurately, hence, the change of the wavelength, the threshold current and the slope efficiency can be reduced.

SECOND EMBODIMENT

A temperature control for an optical element (for example, Etalon) will be explained as an Example 1 below.

Figure 3:
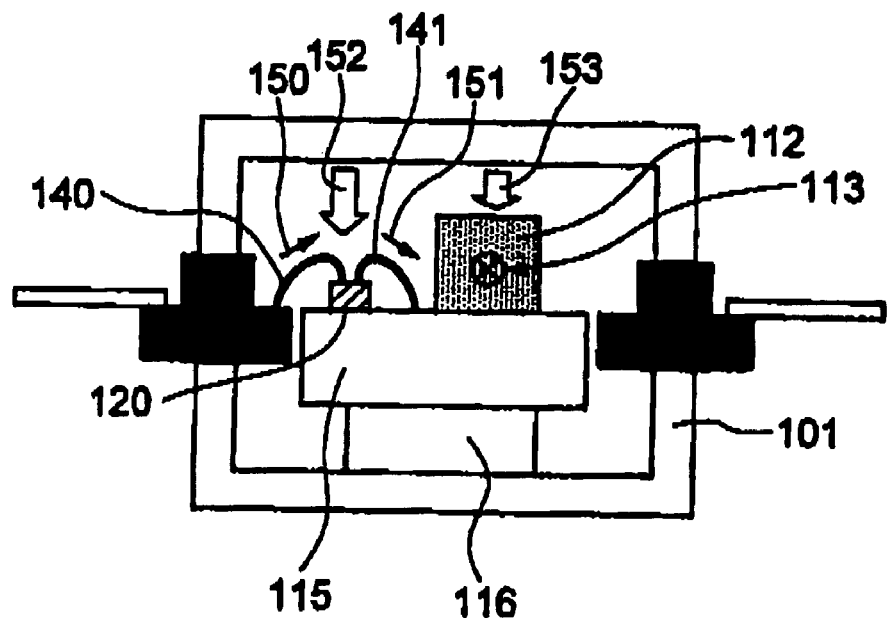
FIG. 3 shows the second embodiment of the optical module in accordance with the invention.

FIG. 3 is an explanatory drawing of the 2nd embodiment of the optical module of the invention (Example 1). In this configuration, an optical element 112, such as Etalon or the like is mounted on the base 115 as a replacement of a LD. The optic axis is expressed by 113. An Au wire 114 is bonded between the thermistor 120 and the base 115. Therefore, the heat which flows into the thermistor 120 from the package 1 or the gas, shown by an arrow 150 and 152 transfers to the base 115 through the Au wire 141.

Figure 4:
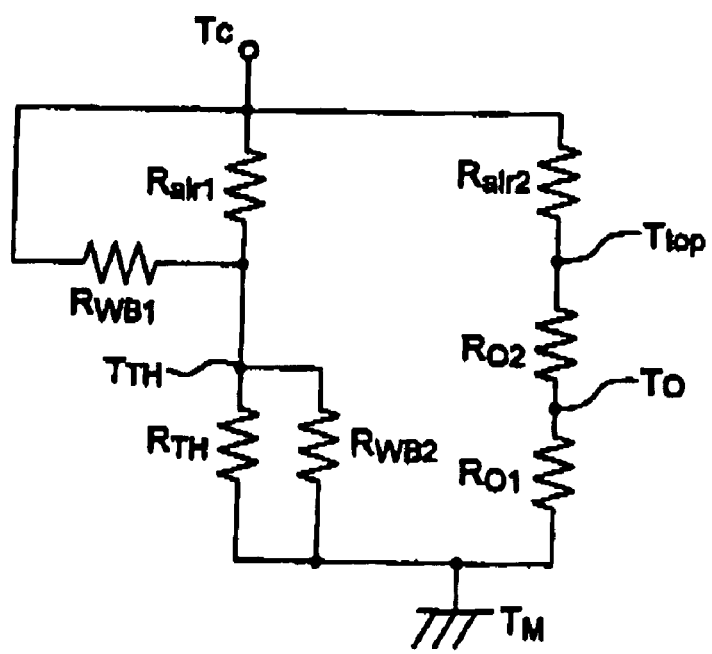
FIG. 4 is an explanatory thermal circuit diagram of the optical module in accordance with the invention shown in FIG. 3.

FIG. 4 is an explanatory thermal circuit diagram of the optical module of the invention shown in FIG. 3.

Abbreviations are expressed below respectively:

T_O: Optical element axis temperature, T_TOP: Optical element top surface temperature, T_C: Case temperature, T_M: Base temperature, T_TH: Thermistor temperature, R01, R02: Thermal resistance of optical element, R_WB1: Thermal resistance of Au wire between a case and a thermistor, R_air1: Thermal resistance of gas between a case and a thermistor, Rair2: Thermal resistance of gas between a case and an optical element. R_WB2: Thermal resistance of Au wire between a thermistor and a base.

When using an optical element such as Etalon which characteristic is sensitive to a temperature, it is important to measure a temperature of the optical element accurately. However, the optical element has larger volume than the LD element, and it is typically made of a low thermal conductivity material.

Therefore, a difference of temperature is inevitably produced between an internal and an outer surface of the optical element.

Since the measurement point must be the inner side of the optical element where is on the optical axis, the thermistor mounted on the surface of the base or the surface of the optical element can not measure the temperature of the optical axis directly.

An optical axis temperature of the optical element is expressed as following formula referring to the thermal circuit diagram mentioned above.

$$T_O = \frac{R_{O1}}{R_{O1} + R_{O2} + R_{air2}} (T_C - T_M) + T_M \quad (11)$$

The condition required to measure the optical axis temperature of the optical element accurately is shown in the formula below:

$$\frac{R_{O1}}{R_{O1} + R_{O2} + R_{air2}} = \frac{R_{TH} + R_{WB2}}{\frac{R_{TH} R_{WB2}}{R_{TH} R_{WB2}} + \frac{R_{air1} + R_{WB1}}{R_{air} + R_{WB1}}} \quad (12)$$

Therefore, it is possible to measure the optical axis temperature of the optical element accurately by satisfying the formula (12) by varying R_WB1 (Thermal resistance of Au wire between the case and the thermistor), and R_WB2 (Thermal resistance of Au wire between the thermistor and the base).

Moreover, when the thermal resistance of the optical element is sufficiently high, same result can be obtained by only varying R_WB1 but not changing R_WB2.

THIRD EMBODIMENT

As an example 2, the case when the heat flow into the thermistor from the outside is small will be explained below.

Figure 5:
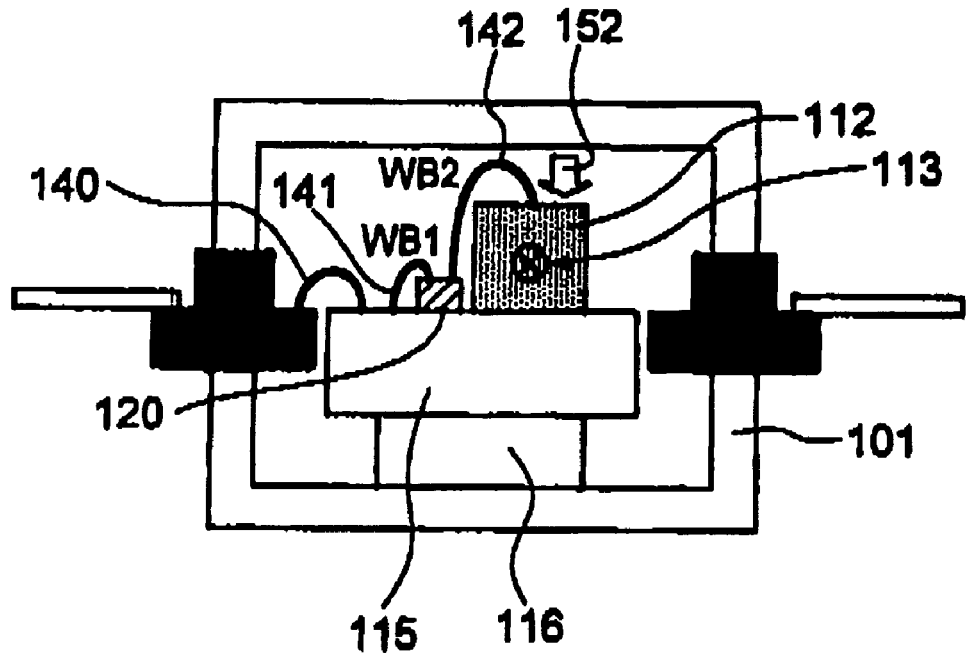
FIG. 5 shows the third embodiment of the optical module in accordance with the invention.

FIG. 5 is an explanatory drawing of the 3rd embodiment of the optical module of the invention (example 2). In this configuration, an Au wire 140 is bonded between the package 101 and the base 115, and an Au wire 141 is bonded between the base 115 and thermistor 120, further an Au wire 142 is bonded between the thermistor 120 and the optical element 112.

Figure 6:
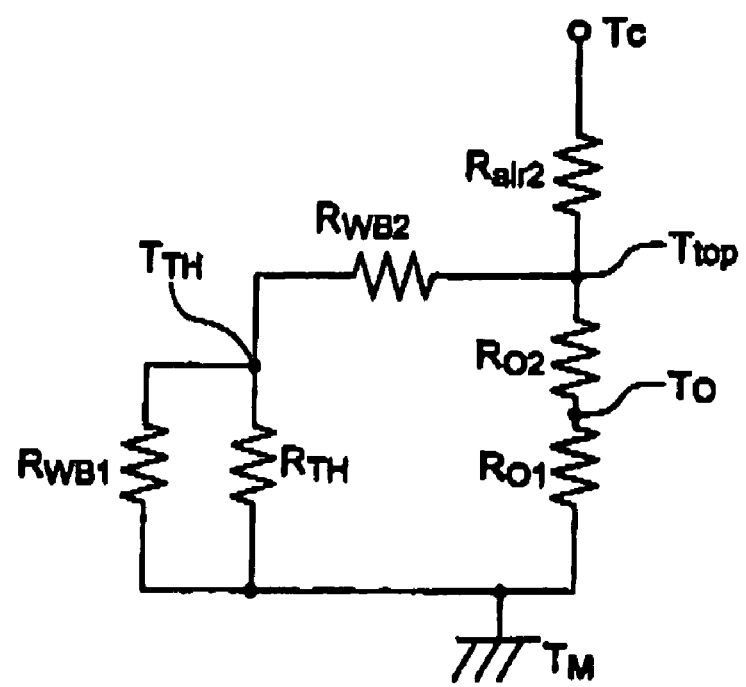
FIG. 6 is an explanatory thermal circuit diagram of the optical module in accordance with the invention shown in FIG. 5.

FIG. 6 is an explanatory thermal circuit diagram of the optical module of the invention shown in FIG. 5. Abbreviations are expressed below respectively:

T_O: Optical element axis temperature, T_TOP: Optical element top surface temperature, T_C: Case temperature, T_M: Base temperature, T_TH: Thermistor temperature, R01, R02: Thermal resistance of an optical element, R_WB1: Thermal resistance of an Au wire between a case and a thermistor, Rair1: Thermal resistance of gas between a case and a thermistor, Rair2: Thermal resistance of gas between a case and a LD, and R_WB2: Thermal resistance of an Au wire between a thermistor and an optical element.

This case is one example when the heat flow into the thermistor from the outside is small. In the example 2, the temperature reference point is set to the point of the top and bottom surface of the optical element.

An optical axis temperature of the optical element is expressed as following formula referring to the thermal circuit diagram mentioned above.

$$T_O = \frac{R_{O1}}{R_{O1} + R_{O2}} = (T_{TOP} - T_M) + T_M \qquad (13)$$

The condition for measuring the optical axis temperature of the optical element accurately is shown in the formula below:

$$\frac{R_{O1}}{R_{O1} + R_{O2}} = \frac{\frac{R_{TH} R_{WB1}}{R_{TH} + R_{WB1}}}{\frac{R_{TH} R_{WB1}}{R_{TH} + R_{WB1}} + R_{WB2}} \qquad (14)$$

Therefore, it is possible to measure the optical axis temperature of the optical element accurately by satisfying the formula (14) by varying $R_{WB1}$ (Thermal resistance of Au wire between the base and the thermistor) and $R_{WB2}$ (Thermal resistance of an Au wire between the thermistor and the optical element).

Moreover, when taking consideration of the heat flow from the gas to the thermistor, it may appropriately lower the $R_{WB1}$ to suppress it.

Another method of reducing apparent $R_{TH}$ is changing the thermal resistance by varying a length, a diameter, a number of the wires and material of the bonding wire which connects the terminals inside of the package to the each part.

Also, as another example, the thermal resistance of the gas filled in the package can be adjusted appropriately by changing its kind of gas, a mixing ratio, a partial pressure of the gas.

Hereafter details of them will be described.

FOURTH EMBODIMENT

Figure 9:
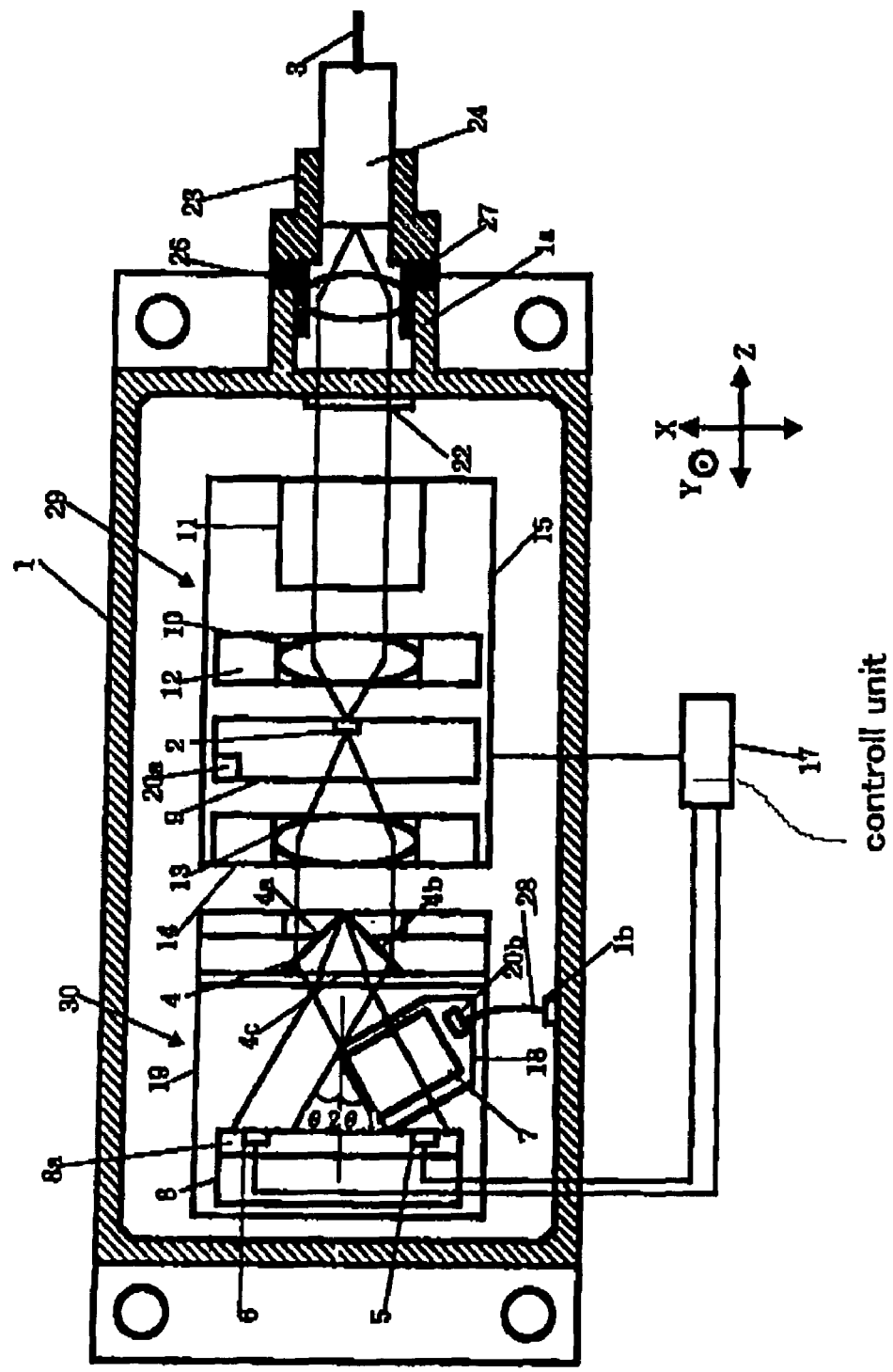
FIG. 9 is a plan cross sectional view showing the fourth embodiment of the optical module in accordance with the invention
Figure 10:
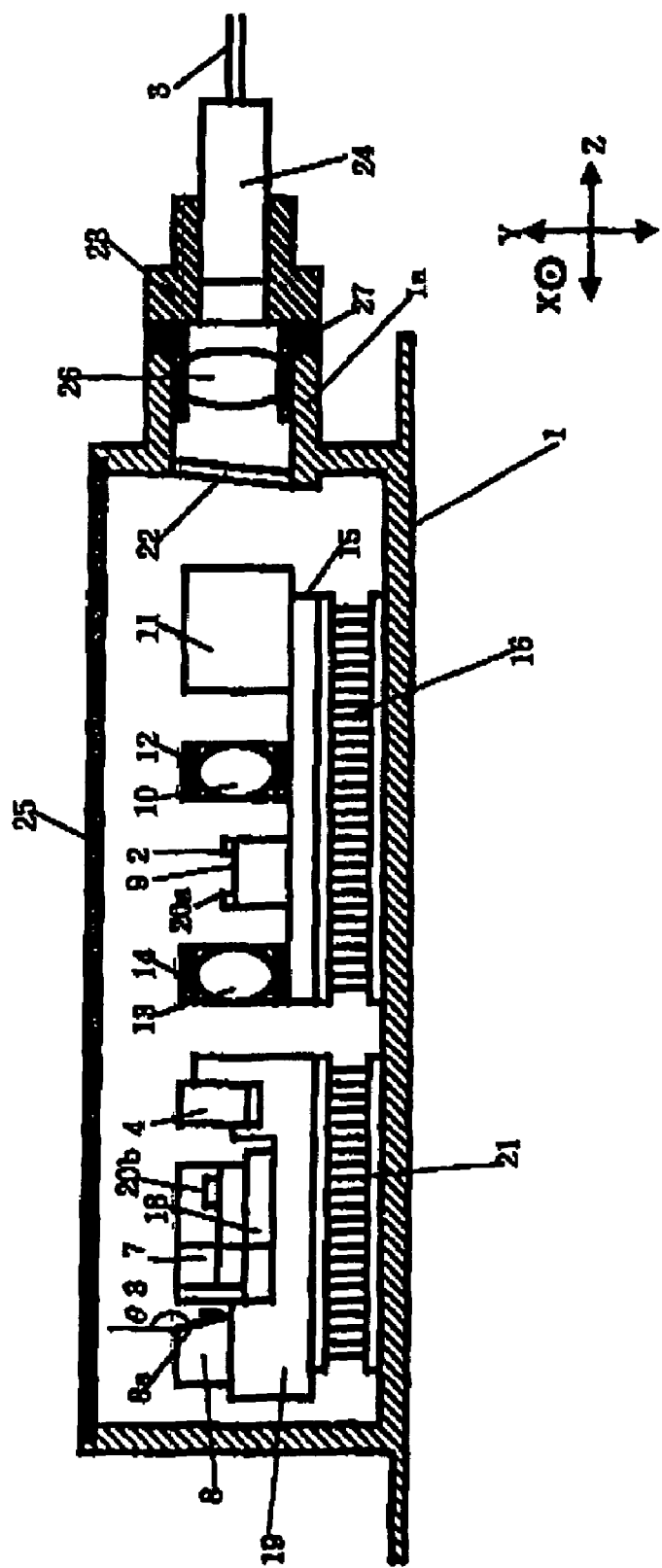
FIG. 10 is a side cross sectional view showing the fourth embodiment of the optical module in accordance with the invention

FIG. 9 is a plan cross sectional view showing the fourth embodiment of the optical module of the invention and FIG. 10 is a side cross sectional view showing the fourth embodiment of the optical module of the invention.

As shown in FIG. 9 and FIG. 10, the optical module of the fourth embodiment of the invention comprises:

a package 1 which sealed hermetically;

a light emitting element 2 furnished in the package 1 such as a semiconductor laser element etc which emits a laser;

an optical fiber 3 which receives the laser emitted from the front portion (right side in FIG. 9) of the light emission element 2 and sends out the laser;

a prism 4 (light splitting material) bends the laser for monitoring, which emitted from the rear portion (left side in FIG. 9) of light emission element 2, into two directions at predetermined angle θ1 and θ2, inclined less than 90 degrees from the optical axis;

a 1st photodiode 5 (1st light receiving element) which receives the one light ray divided by the prism 4;

a 2nd photodiode 6 (2nd light receiving element) which receives another light ray light divided by the prism 4 an optical filter 7 which is placed between the 1st photodiode 5 and the 2nd photodiode 6 and allows the laser of predetermined wavelength band to pass through; and a PD career 8 (attachment part) which mounts the 1st photodiode 5 and the 2nd photodiode 6 on the same plane (same Attachment plane 8a in this case).

The light emitting element 2 is fixed on the LD career 9. Also the thermistor 20a for sensing the temperature of the light emitting element 2 is mounted on the LD career 9.

A collimator lens (the 1st lens) 10 which makes a parallel ray of the laser emitted from the front portion of the light emitting element 2, and an optical isolator 11 which stops a reflection from the optical fiber 3 are constructed between the light emitting element 2 and the optical fiber 3. The collimator lens 10 is hold by the 1st lens holder 12.

A collimator lens 13 which makes a parallel ray of the laser emitted from the rear portion of the light emitting element 2 for monitoring use is placed between the light emitting element 2 and the prism 4. The collimator lens 13 is hold by the 2nd lens holder 14.

The LD career 9, the optical isolator 11, the 1st lens holder 12 and the 2nd lens holder 14 are fixed on the 1st base 15. The 1st base 15 is mounted on the 1st temperature control unit 16 that includes a Peltier module to cool down the heat generated by the light emitting element 2 (Refer to FIG. 10).

The PD current from the 1st photodiode 5 and the 2nd photodiode 6 are inputted into the control unit 17, and the control unit 17 controls the 1st temperature adjustment part 16 to control the wavelength of the laser emitted from the light emitting element 2 corresponding to the PD current feedback.

The prism 4 comprises an optical incident surface formed in the roof shape consists of two slanted plane 4a and 4b and an optical emergent surface of flat plane 4c, wherein it receives the light from the light emitting element 2 through the two slanted surface of 4a and 4b as an incident light and branched into two rays.

An AR (Anti Reflection) coating is treated on the all surface of the prism 4 in order to suppress the reflection of the light. The inclined angle θ1 and θ2 divided by the prism 4 is desired being around same angle (for example, within 15-45 degree) as it helps to decide easily a receiving position for the 1st photodiode 5 and the 2nd photodiode 6.

The optical filter 7, typically made of Etalon, is bonded by a low melting glass or a solder to the filter holder 18 which is formed in the shape of about cross-sectional L character. The optical filter 7 can move and adjust the degree of incident angle of the beam of laser ray by the filter holder 18. On the filter holder 18, the temperature sensor part 20b such as a thermistor is placed in order to measure the temperature of the optical filter 7. The wire 28 of high thermal conductivity like Au for current supply is connected by bonding between the temperature sensor part 20b and the external connection terminal 1b furnished in the package 1.

Attachment plane 8a of the 1st photodiode 5 and the 2nd photodiode 6 in the PD career 8 is inclined at angle θ3 (FIG. 2) which exceeds 90 degrees to the direction of incident laser.

The inclined angle θ3 of Attachment plane 8a is desirable being 95 degree or larger in order to reduce a reflection light and obtain a good performance. In addition, when the attachment plane 8a inclines largely from the direction of incidence of laser, the PD current for coupling to the photodiode becomes insufficient, so it is desirable to keep the angle of inclination θ3 less than 135 degree and maintain its degradation of coupling efficiency to be less than 3 dB.

Therefore, the angle θ3 of the attachment plane 8a is desirable being between 95 and 135 degree.

The prism 4, the filter holder 18 and the PD career 8 are mounted on the 2nd base 19. The 2nd base 19 is fixed on the 2nd temperature adjustment part 21 which consists of a Peltier module as shown in FIG. 10. The 2nd temperature adjustment part 21 is controlled so that the temperature measured by the thermistor 20b (20) is being constant.

The light emitting element 2, the LD career 9, the collimator lenses 10, 13, the isolator 11 and the 1st base 15 where these parts is fixed thereon, compose the light emission part 29.

And the prism 4, the optical filter 7, the 1st photodiode 5, the 2nd photodiode 6, the PD career and the 2nd base which fixes further these parts compose the wavelength monitor 30 which monitors the wavelength of laser.

A window part 22 where the light enters after passing the optical isolator 11 and the focusing lens (2nd lens) 26 which condenses the beam of laser at the end of the optical fiber 3, are constructed inside of a flange part 1a which is attached to the side of the package 1.

The focusing lens 26 is hold by the 3rd lens holder 27 which is fixed at the end of the flange part 1a by YAG laser welding, and a metal slide ring 23 is fixed at the end of the 3rd lens holder 27 by YAG laser welding.

The optical fiber 3 is hold by the ferrule 24 and the ferrule 24 is fixed to the inside of the slide ring 23 by YAG laser welding.

A cover 25 (Refer to FIG. 10) is put on the top of the package 1 and hermetically sealed by a resistance welding on the peripheral part.

The laser emitted from the front portion of the optical emission element 2 is made a parallel light ray by the collimator lens 10, and passes the optical isolator 11 and the window part 22, then condensed by the focusing lens 26 and enters at the optical fiber 3 which is hold by the ferrule 24, and it transmits outside.

Furthermore, the light emitted from the rear portion of the light emitting element 2 is made to a collimated beam by the collimator lens 13, and inclined at predetermined angles of $\theta 1$ and $\theta 2$ to the optical axis by the prism 4, and branched into two directions containing the optical axis direction to monitor output power and wavelength.

One beam bent by the prism 4 enters the optical filter 7 by which only the light of predetermined wavelength is allowed to pass, then sensed by the 1st photodiode 5. And another beam is sensed by the 2nd photodiode 6. The PD currents from the 1st photodiode 5 and the 2nd photodiode 6 are inputted into the control unit 17, and the control unit 17 controls 1st temperature control part 16 as appropriate according to the temperature detected by the thermistor 20a to keep a difference of the voltage (or voltage ratio) between two PD currents inputted to the control unit constant, in order to maintain stable wavelength of the light emitted from the light emitting element 2.

In the 4th embodiment of the invention, the thermal resistance of the wire 28 is adjusted in order to keep a balance between the change of the temperature of the optical filter 7 induced by the heat flow through the surface of the optical filter 7 and the temperature change of the optical filter 7 induced by the heat flow through the wire 28 which connects the temperature measurement part 20b to the external terminal 1b in the package 1. The adjustment of the thermal resistance of the wire 28 is conducted by varying at least one of a length, a diameter, a number of wires, and a kind of material of the wire, Generally, a thermal resistance of a wire $R_{TH}$ is calculated by following formula.

$$R_{TH} = \rho \cdot L/S$$

where
$\rho$=Constant number
L=Wire length
S=Cross sectional area of wire (A number of wires, a diameter, etc.)

Figure 14:
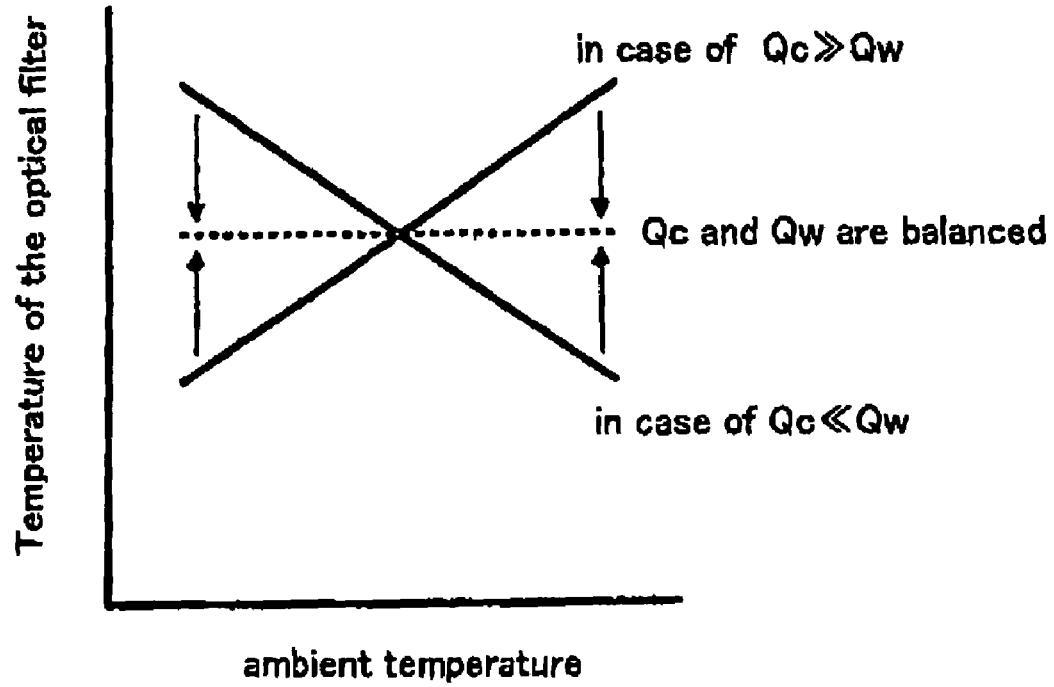
FIG. 14 is a graph showing changes of the temperature of the optical filter vs the atmosphere temperature by the influence of the heat flow.
Figure 15:
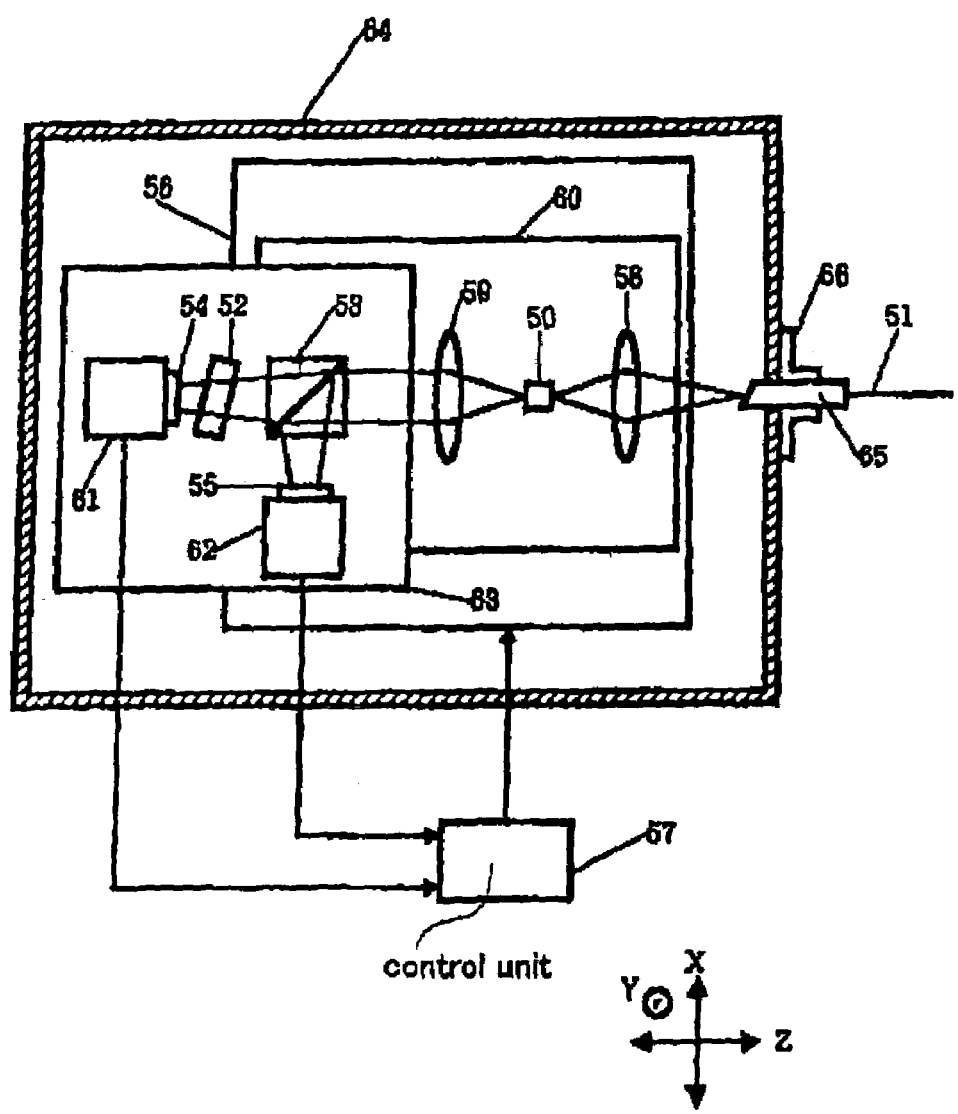
FIG. 15 shows a configuration of the optical module equipped with the conventional wavelength monitor.

Therefore, as shown in FIG. 14, when an influence from the heat flow Qc through the optical filter 7 top part (surface) is so large, the thermal resistance of the wire 28 is lowered by shortening a length of the wire 28, increasing a diameter of the wire 28 or increasing a number of the wire 28, hence the influence from the heat flow Qw through the wire 28 which connects between the temperature sensor part 20b and the terminal 1b for external connection becomes smaller.

Like this, it becomes possible to measure a temperature of the optical filter 7 and control it stable by keeping a balance of the temperature change of the optical filter 7 by adjusting an influence from the heat flow Qc and Qw. Then, it can reduce a drift of the wavelength discrimination curve in the optical filter 7 for a change of atmosphere temperature. It is also practical to remove unnecessary wires from a plurality of wires prepared in advance when optimizing a number of the wires 28.

Figure 11A:
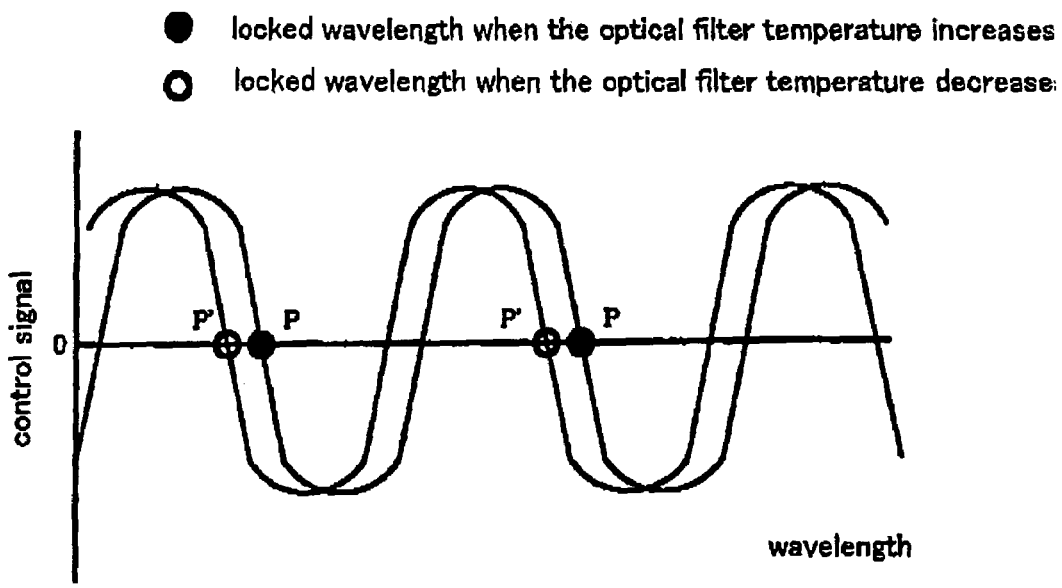
FIG. 11A is a graph showing a drift of the wavelength discrimination curve vs temperature of the optical filter.
Figure 11B:
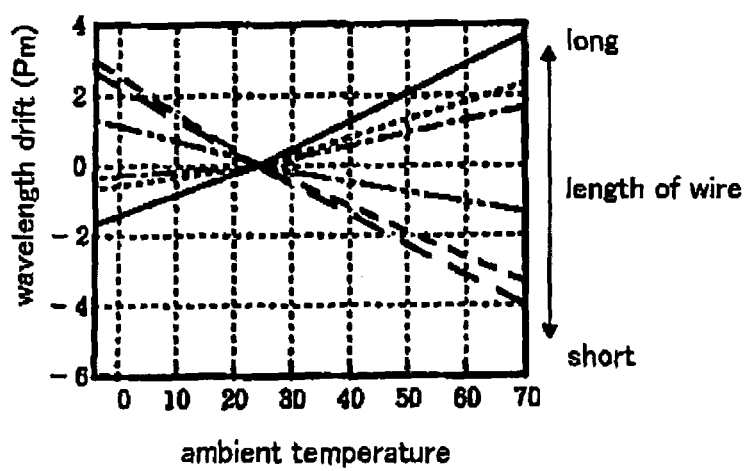
FIG. 11B is a graph showing a drift of the wavelength discrimination curve vs ambient temperature under various length of the wire.

FIG. 11(A) is a graph showing a drift of the wavelength discrimination curve vs. temperature of the optical filter and FIG. 11(B) is a graph showing a drift of the wavelength discrimination curve vs. ambient temperature under various length of the wire. As shown in FIG. 11(A), the wavelength discrimination curve drifts towards a longer wavelength when the optical filter temperature increases by an influence of ambient temperature, and the wavelength discrimination curve drifts towards a shorter wavelength when the optical filter temperature decreases. On the contrary, as shown in FIG. 11(B), it is obvious that it can control a drift of the wavelength discrimination curve vs. ambient temperature by varying a length of the wire for example.

The optical module wherein the light emitting element 2 and the optical filter 7 are placed on the same temperature adjustment part and the thermal control of the optical filter 7 is conducted based on the temperature measured by the sensor, can monitor the wavelength accurately.

FIFTH EMBODIMENT

In the 5th embodiment of the invention, in order to maintain a balance between a change of a temperature of the optical filter 7 by the heat flow through the surface of the optical filter 7 and a change of a temperature of the optical filter 7 by the heat flow through the wire 28 which connects between the temperature sensing part 20b and the terminal 1b for external connection, its adjustment is conducted by varying a thermal resistance of the gas filled in the package 1. For example, the adjustment of the thermal resistance of the gas filled in the package 1 is conducted by changing a kind of gas (for example, Xenon, nitrogen, etc.) accordingly.

According to the 5th embodiment of the invention, the temperature of the optical filter 7 can be stabilized, and it becomes possible to reduce a drift of a wavelength discrimination curve of the optical filter 7 vs the ambient temperature. Wherein, it also is possible to reduce a power consumption of the temperature adjustment part when using a gas having a thermal conductivity of less than 20 mW/K·m such as Xenon.

SIXTH EMBODIMENT

Figure 12:
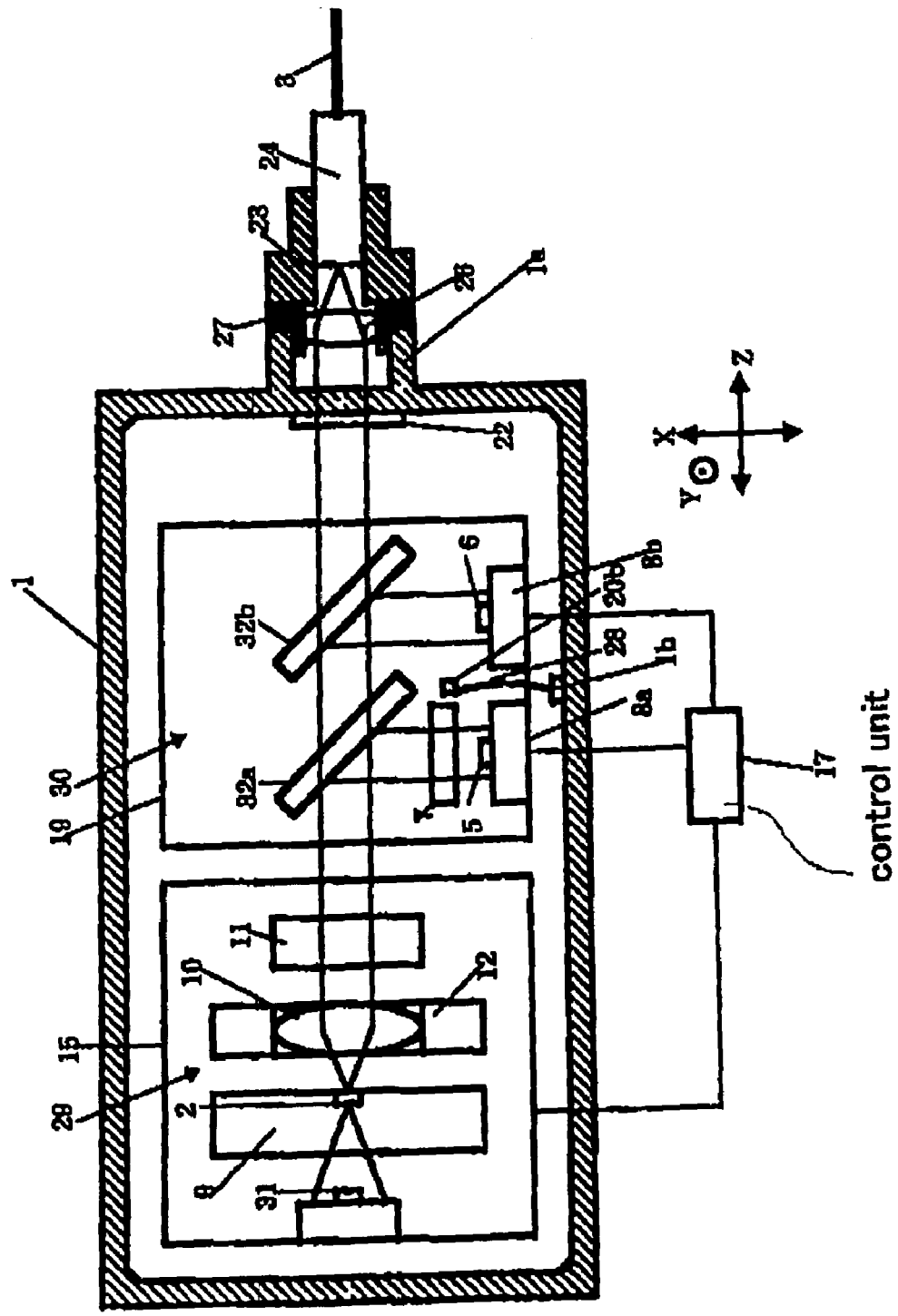
FIG. 12 is a plan sectional view showing the 6th embodiment of the optical module in accordance with the invention.

FIG. 12 is a plan cross sectional view showing a semiconductor laser module according to the 6th embodiment of the invention. As shown in FIG. 12, wherein the wavelength monitor 30 is placed in front side (Right side in FIG. 12) of the light emission part 9.

A light emitting element 2, a ollimator lens 10 which makes parallel ray of light emitted from front facet (Right side in FIG. 12) of the light emitting element 2, a photodiode 31 which receives the light emitted from the rear facet (Left side in FIG. 12) of the light emitting element 2 for monitoring the output of the light and an optical isolator which blocks the light reflected from the wavelength monitor 30 to the light emitting element 2 are constructed in the light emission part 29, The light splitting part in the wavelength monitor 30 comprises a 1st half mirror 32a and a 2nd half mirror 32b, wherein each part is located in series along the direction of the Z-axis.

The 1st half mirror 32a divides the light emitted from the light emitting element 2 into the 1st direction for the 1st photodetector 5 (X axis direction), and the 2nd direction for the 2nd half mirror 32b (Z axis direction). The 2nd half mirror 32b divides the light from the 1st half mirror 32a into the 3rd direction for the 2nd potodetector 6 (X axis direction), and the 4th direction (Z axis direction).

The light divided by the 2nd half mirror 32b into the 4th direction (Z axis direction) passes through the window 22 and the focusing lens 26 then enters upon the optical fiber 3 which is hold by the ferrule 24, and transmits outside.

The operation of the light emitting part 5 and the wavelength monitor 30 in the 6th embodiment is the same as the 4th and 5th embodiment. In the FIG. 12, the 1st photodetector 5 and the 2nd photodetector 6 are mounted on the different PD career 8a and 8b respectively, but they can be mounted on the same attachment part 8.

Also, the optical isolator 11 can be placed on the wavelength monitor 30 and rear side of the 1st half mirror 32a (Left-hand side in FIG. 12).

SEVENTH EMBODIMENT

Figure 13:
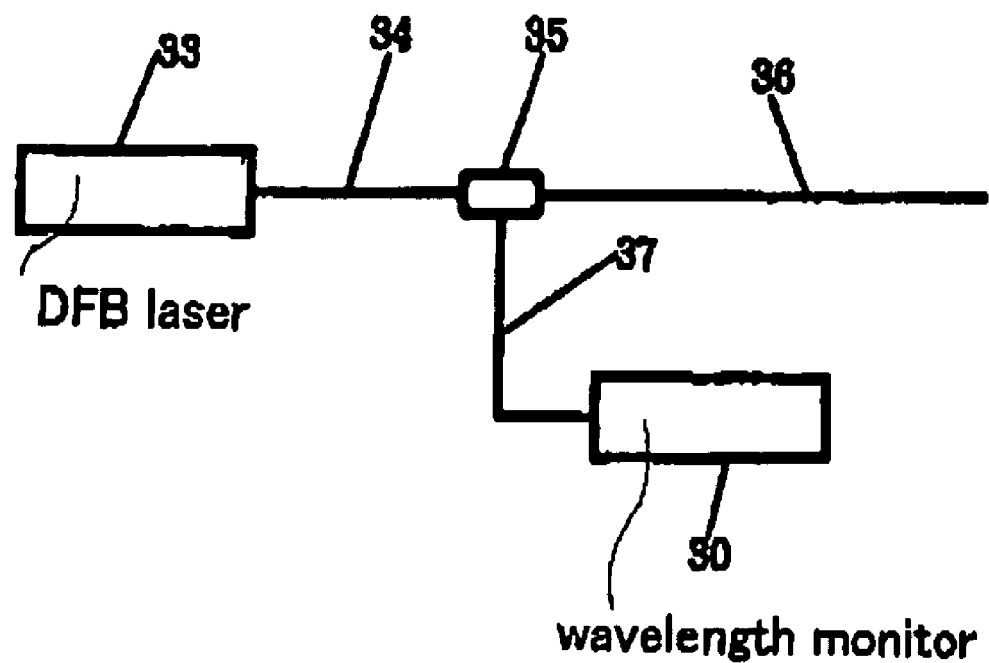
FIG. 13 is a diagram showing the wave length monitor in the 7th embodiment of the invention.

FIG. 13 is an explanatory diagram showing the wavelength monitor according to the 7th embodiment of the present invention, wherein the wavelength monitor 30 is mounted outside of the optical module. As shown in FIG. 13, a DFB laser 33 (DFB laser source) is connected to an optical coupler 35 through the optical fiber 34, and a partial light of the DFB laser 33 is used for the measurement and the rest of the light is carried into the optical fiber 36 as a signal light. The light for measurement is carried into the wavelength monitor 30 through the optical fiber 37. The structure and operation of the wavelength monitor 30 is the same as the 4th embodiment.

Not limited to the above application but various modifications are possible within the scope described in the claims. For example, the wire 28 for an electric current supply is connected directly between the temperature sensing part 20a and the external terminal 1b, but it may connect by plural wires via connecting points.

Another method for reducing the apparent $R_{TH}$ is conducted by adjusting the temperature at middle part between the terminals inside the package and the parts electrically connected thereto. It is alternative method to control the temperature of the bonding wire at the package side by a small thermo electrical element, additionally to a thermo electrical element used for controlling whole the career.

Figure 16:
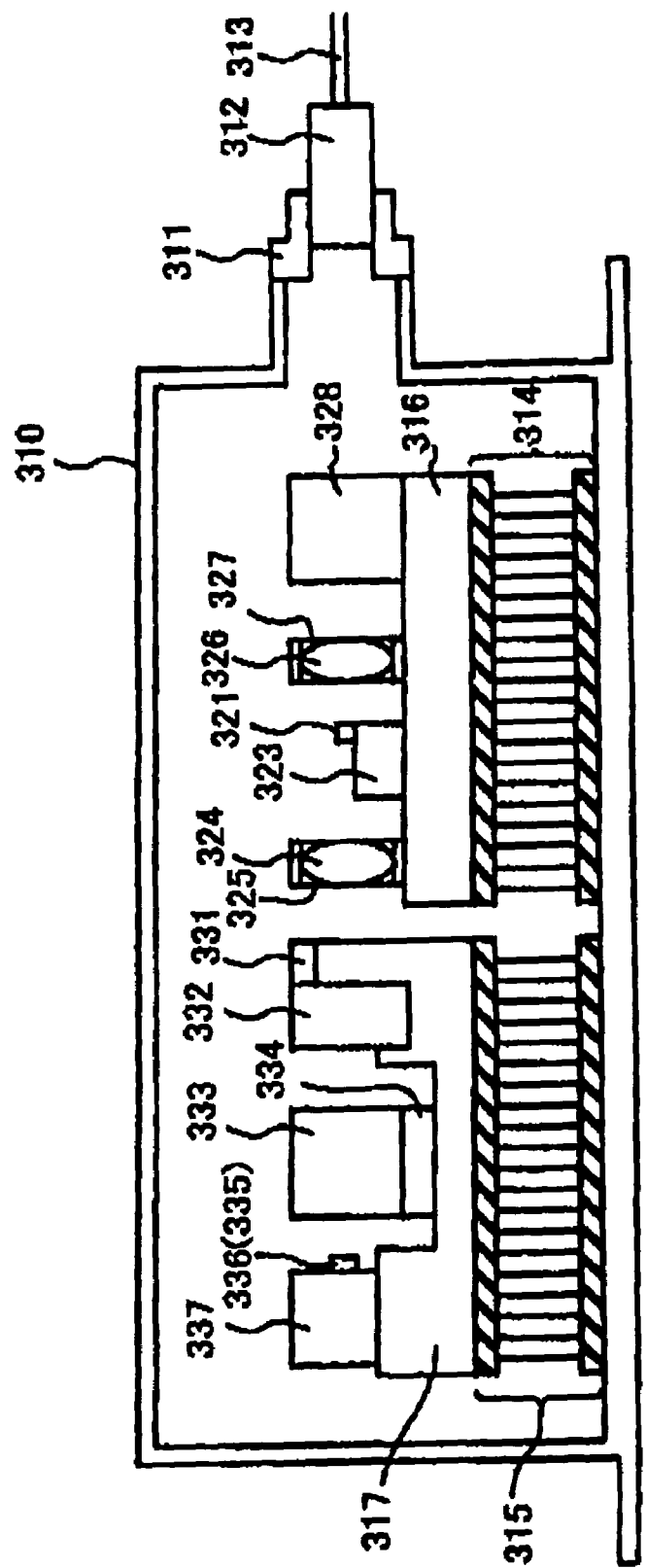
FIG. 16 is a side sectional view showing the 8th embodiment of the optical module in accordance with the invention.
Figure 17:
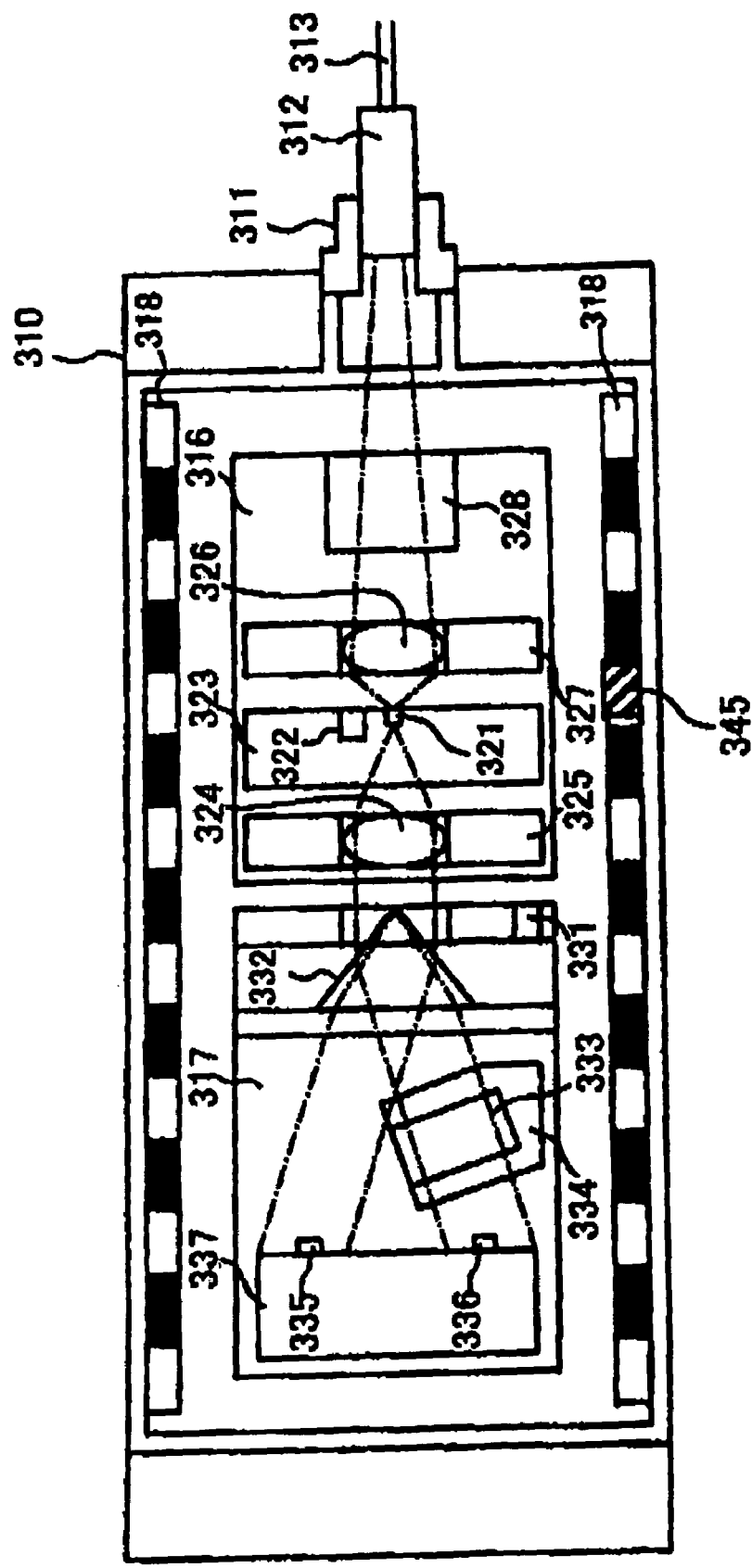
FIG. 17 is a top cross sectional view showing the 8th embodiment of the optical module in accordance with the invention.
Figure 18:
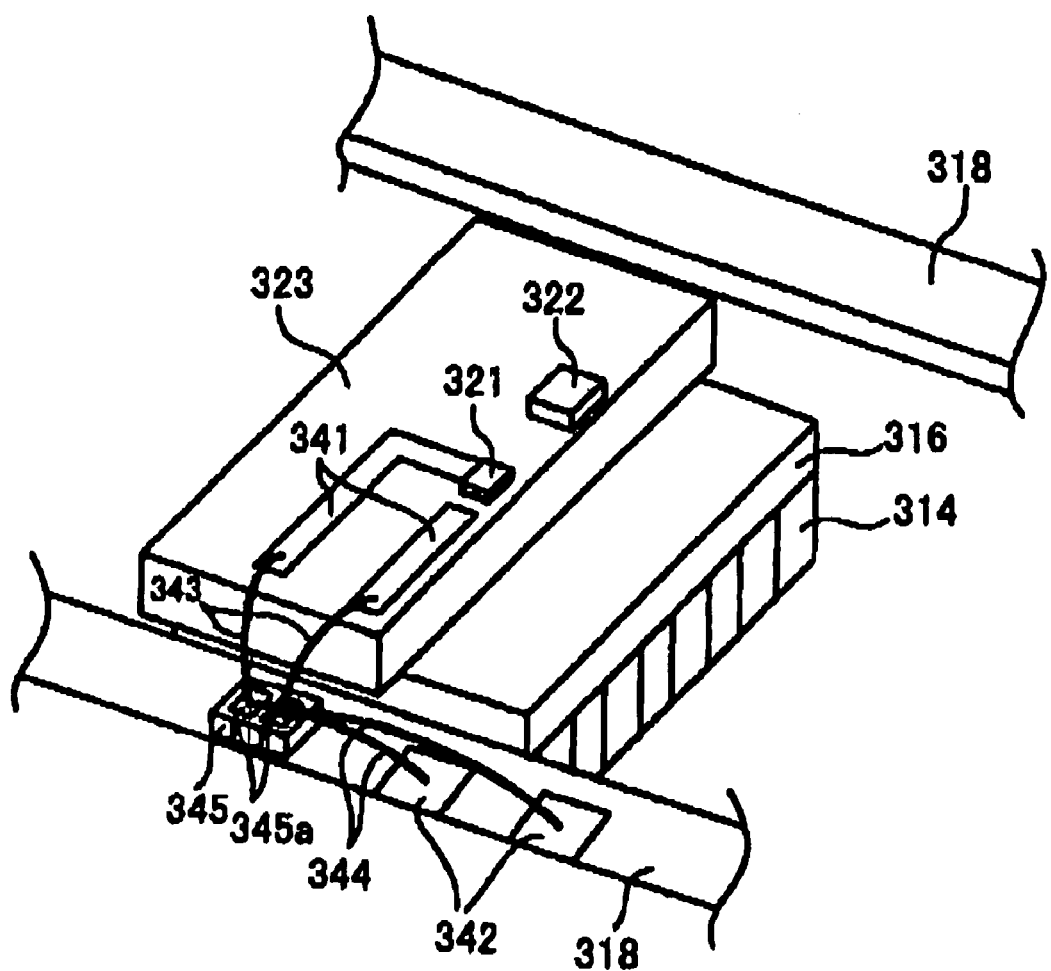
FIG. 18 is a partially enlarged perspective view showing the 8th embodiment of the optical module in accordance with the invention.

Referring to FIG. 16 to FIG. 18, the semiconductor laser module of the 8th embodiment of the invention is explained. FIG. 16 is a side sectional view, FIG. 17 is a top cross sectional view and FIG. 18 is a partially enlarged perspective view showing the semiconductor laser module of the invention respectively.

As shown in FIGS. 16 and 17, the semiconductor laser module of the 8th embodiment comprises the package 310 having various optical parts therein, and the optical fiber 313 inserted in the ferrule 312 being constructed through the sleeve 311 furnished to the opening area of the package 310. In this configuration it works to so send out the laser into an optical fiber 313.

As shown in FIG. 16, the 1st thermoelectric module 314 and the 2nd thermoelectric module 315 are constructed in the bottom of the package 310. The 1st thermoelectric module 314 and 2nd thermoelectric module 315 are composed from a relatively large Peltier element or the like, then works to heat up or cool down the surface controlled by the intensity and direction of the current.

In addition, many lead pins (un-illustrated) are prepared in the side of the package 310 and connected electrically to the each component in the semiconductor laser module through the internal terminal 318 (FIG. 17) and the bonding wires (un-illustrated) within the package 310. And the 3rd electro thermoelectric module 345 is connected to another end of the internal terminal 318 as a wiring configuration (FIG. 18) described later.

On the 1st thermoelectric module 314 which functions as a temperature control part of the invention, the 1st base 316 which contains the various optical parts composing the laser optical system. On the 1st base 316, the submount 323 where the semiconductor laser element 321 and the thermistor 322 are mounted thereon, the lens holder 325 holding the collimating lens 324, and the lens holder 327 holding the focusing lens 326, and the optical isolator 328 are mounted.

In this configuration, the semiconductor laser element 321 is a light source emitting a laser of predetermined wavelength, and whose temperature is controlled according to the invention. The laser emitted from the front portion of the semiconductor laser element 321 is converged by the focusing lens 326 and passes through the optical isolator 328 and coupled with the optical fiber 313 then it becomes as an output light. The optical isolator 328 works to stop the light of reflection from the optical fiber 312. And the laser emitted from the rear facet of the semiconductor laser 321 is made a parallel ray by the collimator lens 324, and enters into the wavelength monitoring system as described later. The thermistor 322 is mounted on the submount 323 and is used to measure the surrounding temperature of the semiconductor laser element 321.

Furthermore, the 2nd base 317 which includes the various optical components for the wavelength monitor is mounted on the 2nd thermoelectric module 315. On the 2nd base 317, the thermistor 331, the prism 332, the filter holder 334 wherein the optical filter 333 is attached, and the submount 337 wherein the 1st photodiode 335 and the 2nd photodiode 336 are attached thereto.

In this configuration, the laser after passing the collimator lens 324 is divided into two directions by the prism 332. The prism 332 has a roof shape formed from two planes aligned slant viewing from the optical axis, and positioned so that the laser enters at the ridge line around the center of the prism 332. As shown in FIG. 17, when the laser passes through the prism 332, it branches into two directions of one inclined angle and another laser inclined at predetermined angle respectively.

The one laser divided by the prism 332 enters to the 1st photodiode 335 and another laser divided by the prism 332 enters to the 2nd photodiode 336 through the optical filter 333. This optical filter 333 is a transmissive component with selectively allowing to pass a predetermined wavelength for monitoring the wavelength of the laser.

The 1st photodiode 335 and the 2nd photodiode 336 are mounted on the same plane of the submount 337 so as to meet the each direction of the lights and outputs the photoelectric current in corresponding to the light intensity of the incident laser respectively.

And each photoelectric current is fed to the external control part (un-illustrated). The control part receives the output of the 1st photodiode 335, and the 2nd photodiode 336, and computes the ratio of output value of the 1st photodiode 335 and the 2nd photodiode 336. In this way, the change in wavelength of the semiconductor laser element 321 is monitored based on the change of the computed ratio of the outputs. In addition, the thermistor 331 is placed near the prism 332 on the 2nd base 317 and senses the adjacent area temperature.

The control part supplies an appropriate voltage to the 1st thermal electric element 314, and the feedback control is conducted so that it adjusts the wavelength while monitored as described above.

Based on the output of the thermistor 322, the temperature of the semiconductor laser element 321 is monitored and the oscillation wavelength of the semiconductor laser element 321 is controlled appropriately by controlling the 1st electric thermoelectric module 314. In addition, based on the output of the thermistor 331, the control part supplies the required voltage to the 2nd thermoelectric module 315 and perform a feedback control to maintain the temperature of the optical parts such as the optical filter 333.

Referring to FIG. 18, the wiring structure of the invention will be explained hereafter. As shown in FIG. 18, a pair of terminals 341 connected to the semiconductor laser element 321 is mounted on the submount 323, and it electrically connects to a pair of terminals 342 furnished on the internal terminal 318 in the package 310 through a bonding wire 343, 344. And the terminals 342 are connected to the lead pins as designated.

The small 3rd thermoelectric module 345 is constructed on the internal terminal 318. This 3rd thermoelectric module 345 works as an assist temperature control component of the invention, and composed from a relatively small size Peltier element. A pair of terminal 345a is furnished on the upper surface of the 3rd thermoelectric module 345, and the bonding wire 343 connects the terminal 345a of the 3rd thermoelectric module 345 to the terminal 341 of the submount 323, in addition, it connects the terminal 345a of the 3rd thermoelectric module 345 to the terminal 342 of the package 310 by the bonding wire 344. In that, the 3rd thermoelectric module 345 is placed between the semiconductor laser diode 321 and the lead pins.

The control voltage is supplied from the control part to the 3rd thermoelectric module 345, similarly to the 1st thermoelectric module 314. Therefore, both of the temperature of the submount 323 and 3rd thermoelectric module 345 can be maintained the same, hence the heat transfer via the bonding wire 343 between thereof is not produced. Like a conventional type, if the 3rd thermoelectric module 345 is not provided, the terminal 341 of the submount 323 and the terminal 342 of the package 310 are directly connected by the bonding wire, the heat transfer occurs from the package 310 to the submount 323 according to the difference of temperature.

The present invention can stop the heat flow likewise. By this configuration, it can improve the efficiency of temperature control for the semiconductor laser element 321 and reduce a difference of temperature and a delay of temperature control then stabilize its operation.

In FIG. 18, it is also applicable to have same wiring structure for the thermistor 322 on the submount 323 as well as the semiconductor laser element 321. In this case, the heat flow to the submount via the wiring material connected to the thermistor 322 can also be reduced.

Figure 19:
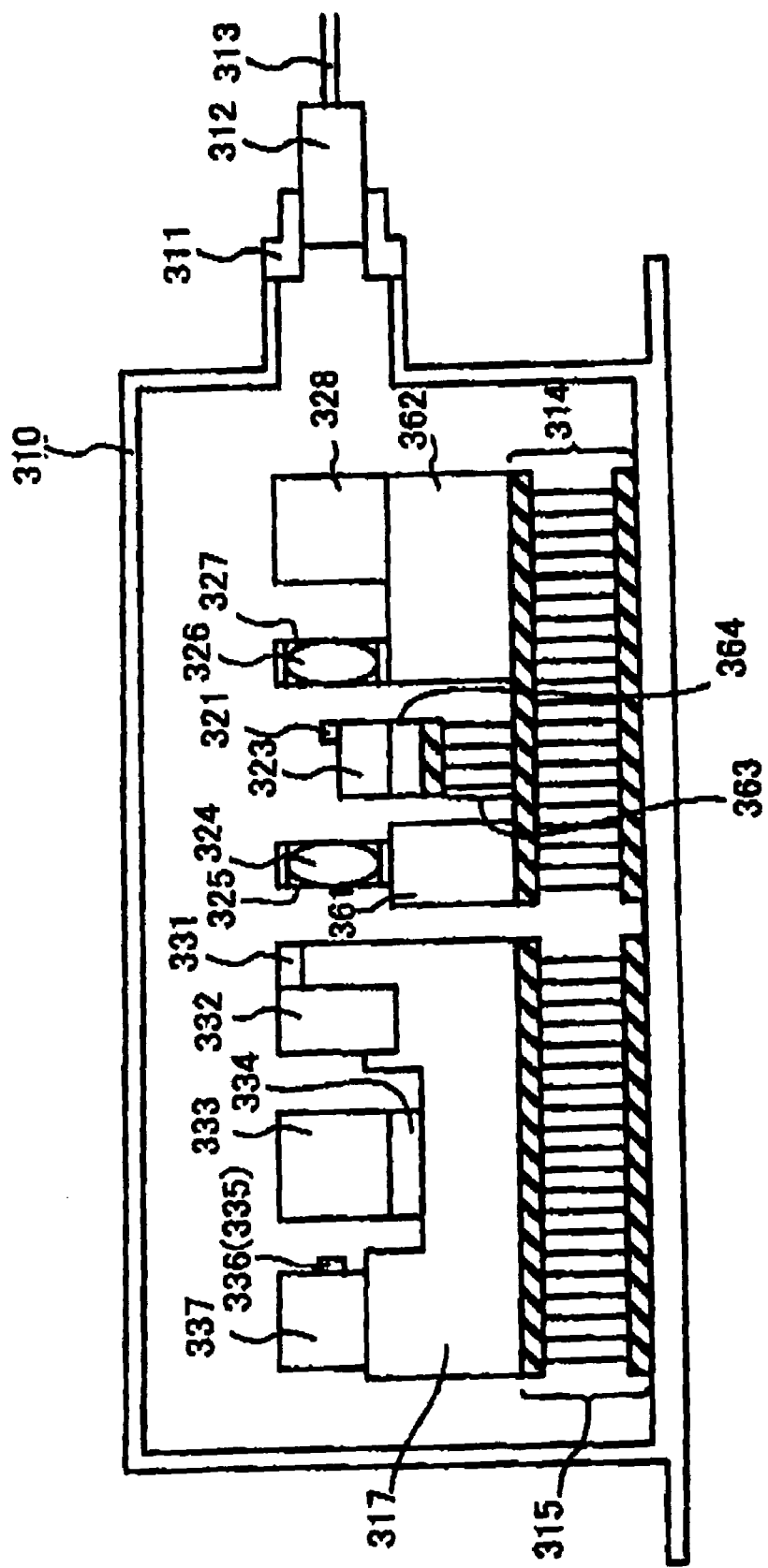
FIG. 19 is a side sectional view showing the 9th embodiment of the optical module in accordance with the invention.
Figure 20:
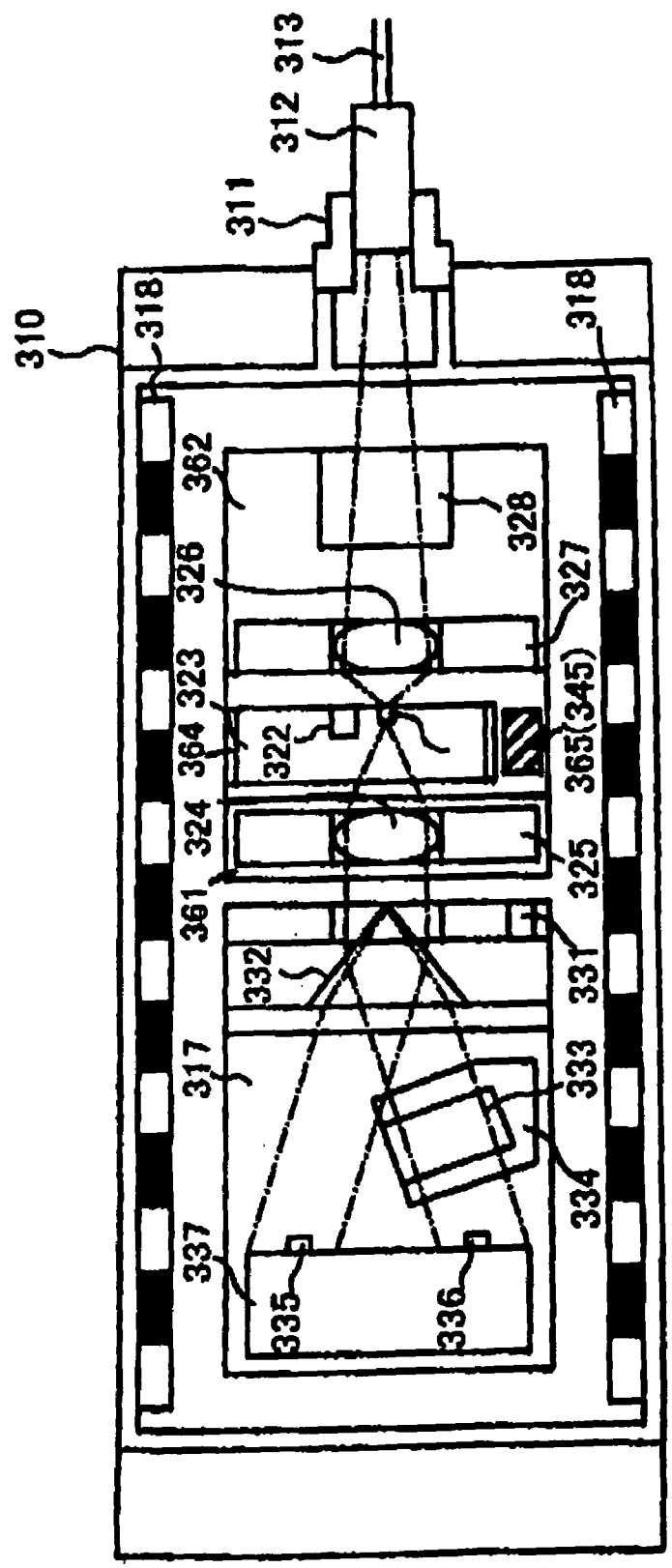
FIG. 20 is a top cross sectional view showing the 9th embodiment of the optical module in accordance with the invention.

Furthermore, referring to FIGS. 19 and 20, the semiconductor laser module of the 9th embodiment of the invention will be explained. FIG. 19 is a side sectional view of the semiconductor laser module of the 9th embodiment corresponding to FIG. 16 of the 8th embodiment, and FIG. 20 is a top cross sectional view corresponding to FIG. 17 of the 8th embodiment. For FIGS. 19 and 20, the same numeral is given to the common components as FIGS. 16 and 17 for the convenient.

As shown in FIGS. 19 and 20, the bases 361, 362 and the 4th thermoelectric module 363 are mounted on the 1st thermoelectric module 314 in case of the semiconductor laser module according to the 9th embodiment.

The lens holder 325 holding the collimator lens 324 is mounted on the base 361 and the lens holder 327 holding a focusing lens 326 and the optical isolator 328 are mounted on the base 362. Furthermore, the submount 323 which contains the semiconductor laser element 321 and the thermistor 322 is mounted on the 4th thermoelectric module 363 through the base 364. In this configuration, the arrangement of the optical system for the laser unit is the same as the 1st embodiment.

In the 9th embodiment, the 1st thermoelectric module 314 and the 4th thermoelectric module 363 are independently controlled. Therefore, the temperature of the semiconductor laser element 321 is controlled independently by controlling the 4th thermoelectric module 363 regardless the temperature control for the other optical parts hence the transfer efficiency improves. And as shown in FIG. 19, the upper 4th thermoelectric module 363 is piled on the lower 1st thermoelectric module 314. In this, the upper 4th thermoelectric module 363 itself is cooled by theist thermoelectric module 314 and has lower temperature than the 1st thermoelectric module 314.

In the 9th embodiment, it is premised that the wiring structure is the same as FIG. 18 in the 8th embodiment. Since the substrate under the 1st thermoelectric module 314 is maintained at the same temperature as the package 310, the heat transfer via wires between the 1st thermoelectric module 314 and the package 310 is not produced. However, when the upper part of the 4th thermoelectric module 363 is connected directly by a wiring to the package 310, the heat flows into the 4th thermoelectric module 363 from the package 310 whose temperature is relatively higher. Consequently, the load of the 4th thermoelectric module 363 increases so that the designed performance may not be achieved.

As shown in FIG. 20, it can reduce the heat transfer in this configuration by adding a via terminal 365 on the 1st thermoelectric module 314, compared with the direct wiring to the internal terminal 318. Furthermore, when replacing the via terminal 365 with a wiring via the small 3rd thermoelectric module 345, the temperature of the parts on the 4th thermoelectric module 363 can be maintained same temperature as the upper surface of the 3rd thermoelectric module 345, hence the heat flow to the 4th thermoelectric module 363 via a wiring is reduced. By this configuration, the operation of the semiconductor laser element 321 can be stabilized as the 1st embodiment.

Not limited to the embodiment explained above, according to the present invention, various modifications are possible. For example, not only applying to a semiconductor laser module, but also applicable to various modules as long as above-mentioned wiring structure is used in the temperature control parts.

According to the above methods, a temperature change of the thermistor and the optical parts such as a laser diode can be made to the same under change of a surrounding temperature. In addition, it is possible not only balancing the heat flow but also possible to reduce or eliminate the heat flow itself by using the method mentioned lastly above.

Furthermore, it is also possible to remove the heat via a bonding wire from a laser diode etc.

According to the present invention, a thermal circuit is formed by Au wire bonding or the like between the place of a reference point of temperature and a thermistor, then a pseudo resistance value of the thermistor in the thermal circuit is adjusted so that a change of thermistor temperature to a change of atmosphere temperature can be controlled being same as a change of LD temperature, then the thermistor can carry out monitoring the LD temperature accurately, and hence it can reduce the change in the wavelength, threshold current and slope efficiency drifting of the LD light. Furthermore, by balancing a change of optical filter temperature induced by heat flow generated by difference in the temperature between the surface of the optical filter or the temperature sensing part and its surrounding temperature, accurate temperature measurement is realized so that it makes possible to reduce a drift of the wavelength discrimination curve of optical filter vs surrounding temperature.

And when controlling a temperature for the temperature adjustment parts contained in the module, the assist temperature control device is added to a wiring which electrically connects the internal terminal of the package to the temperature controlled part, so that it can reduce the heat flow via a wiring material, and prevents to cause a difference and delaying of the temperature control and hence it can realize to stabilize its performance of the thermal adjustment parts.

What is claimed is:

1. An optical module, comprising:
   an optical part having a temperature dependency;
   a temperature measurement part;
   a plurality of thermal conduction adjusting parts;
   a temperature control part on which said optical part, said temperature measurement part and said thermal conduction adjusting parts are directly or indirectly mounted through a base; and
   a package containing said optical part, said measurement part, said thermal conduction adjusting parts and said temperature control part, wherein a first of said plurality of thermal conduction adjusting parts is connect between said package and said temperature measurement part, and a second of said plurality of thermal conduction adjusting parts is connected between said temperature measurement part and said base.

2. An optical module according to claim 1 wherein said optical module further comprises a third thermal conduction adjusting part which connects between said temperature measurement part and a surface of an optical element of said optical part.

3. An optical module according to claim 1 or 2, wherein each of said thermal conduction adjusting parts comprise a wire.

4. An optical module according to claim 3, wherein an adjustment of the thermal conduction in each of said wires is conducted by varying at least one of a length, a diameter, a number of wires and material of said wire.

5. An optical module according to claim 3, wherein each of said plurality of thermal conduction adjusting parts has a function of electrical connection.

6. An optical module according to claim 1, wherein said optical part having a temperature dependency comprises an optical wavelength filter.

7. An optical module according to claim 4, wherein said optical part having a temperature dependency comprises an optical wavelength filter.

8. An optical module according to claim 1, wherein said optical part having a temperature dependency comprises an semiconductor laser element.

9. An optical module according to claim 1, wherein said optical part having a temperature dependency comprises an semiconductor laser element.

10. An optical module according to claim 1, wherein said temperature control part comprises a thermo module including a plurality of thermoelectric modules piled up, wherein each of said thermoelectric module is adjusted independently or cooperatively.

11. An optical module according to claim 1, wherein said temperature control part comprises a thermo module formed from a plurality of thermoelectric modules plied up, wherein each of said thermoelectric module is adjusted independently or cooperatively.

* * * * *